(12) United States Patent
Gaudet et al.

(10) Patent No.: US 9,676,607 B2
(45) Date of Patent: Jun. 13, 2017

(54) MICROMECHANICAL DEVICE WITH AN ACTIVELY DEFLECTABLE ELEMENT

(71) Applicant: Fraunhofer-Gesellschaft zur Foerderung der angewandten Forschung e.V., Munich (DE)

(72) Inventors: Matthieu Gaudet, Cottbus (DE); Klaus Schimmanz, Cottbus (DE); Michael Stolz, Cottbus (DE); Sergiu Langa, Dresden (DE); Holger Conrad, Dresden (DE); Bert Kaiser, Weinboehla (DE)

(73) Assignee: Fraunhofer-Gesellschaft zur Foerderung der angewandten Forschung e.V. (DE)

( * ) Notice: Subject to any disclaimer, the term of this patent is extended or adjusted under 35 U.S.C. 154(b) by 0 days.

(21) Appl. No.: 15/098,089

(22) Filed: Apr. 13, 2016

(65) Prior Publication Data

US 2016/0304333 A1    Oct. 20, 2016

(30) Foreign Application Priority Data

Apr. 15, 2015    (DE) .......... 10 2015 206 774

(51) Int. Cl.
*H01L 29/84* (2006.01)
*B81B 3/00* (2006.01)

(52) U.S. Cl.
CPC ...... *B81B 3/0021* (2013.01); *B81B 2201/032* (2013.01); *B81B 2203/0118* (2013.01); *B81B 2203/0127* (2013.01)

(58) Field of Classification Search
None
See application file for complete search history.

(56) References Cited

U.S. PATENT DOCUMENTS

| | | | |
|---|---|---|---|
| 5,563,466 A | 10/1996 | Rennex et al. | |
| 2002/0009821 A1* | 1/2002 | Moor | B81B 3/0072 438/48 |
| 2004/0165243 A1 | 8/2004 | Helmbrecht | |
| 2007/0058095 A1* | 3/2007 | Miles | B82Y 20/00 349/1 |
| 2011/0115039 A1* | 5/2011 | Huang | B81B 3/0072 257/419 |
| 2012/0181896 A1 | 7/2012 | Kornbluh et al. | |
| 2013/0301101 A1* | 11/2013 | Conrad | G02B 26/0841 359/221.2 |
| 2016/0173001 A1* | 6/2016 | Langa | H02N 1/006 310/300 |

FOREIGN PATENT DOCUMENTS

| WO | WO 2012/095185 A1 | 6/2002 |
|---|---|---|
| WO | WO 02/049199 A1 | 7/2012 |

* cited by examiner

*Primary Examiner* — Michael Lebentritt
(74) *Attorney, Agent, or Firm* — Haynes and Boone, LLP; Robert P. Ziemian

(57) ABSTRACT

Micromechanical devices include actively deflectable elements. The activation is performed by a layer stack which causes the deflection responsive to attractive forces acting upon the layers of the layer stack.

47 Claims, 28 Drawing Sheets

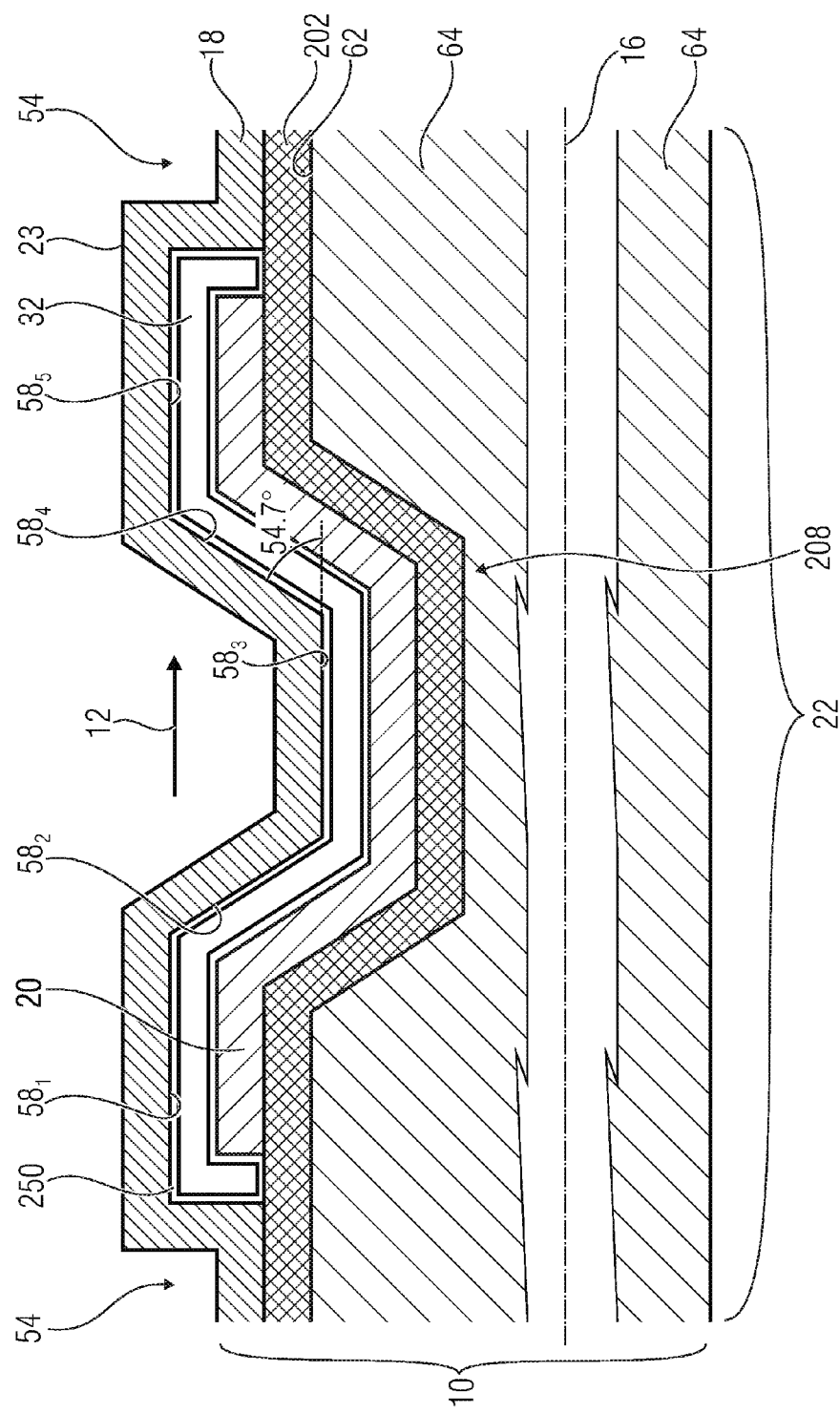

MICROMECHANICAL DEVICE WITH AN ACTIVELY DEFLECTABLE ELEMENT

CROSS-REFERENCE TO RELATED APPLICATIONS

This application claims priority from German Patent Application No. 102015206774.2, which was filed on Apr. 15, 2015, and is incorporated herein in its entirety by reference.

The present invention is concerned with a micromechanical device comprising an actively deflectable element.

BACKGROUND OF THE INVENTION

Micromechanical devices having a deflectable element such as a cantilever or membrane are used in a multitude of technical fields, such as in spatial light modulators or in projectors for beam deflection, just to mention a few examples.

Primarily, electrostatic attraction used in micro and nano actuators as the principle for deflection. Mostly, different electrostatic potentials are applied to a deflectable element and a static electrode so that by aid of an electrostatic attraction developing therebetween, a deflection is caused. The force is indirectionally proportional to the square of the distance between the deflectable element which serves as a first electrode and the second, static electrode. Owing to this relation, a pull-in effect manifests itself in case of exceeding a predetermined potential difference, wherein the deflectable element is accelerated towards the static electrode with contacting the latter. Due to this, using an electrostatic actuator involves the provision of sufficient distance between the static electrode and the deflectable element. This in turn increases the voltages to be applied in order to achieve a certain amount of deflection as the electrostatic force is lower for increased distances. Voltages up to 100 V or even more are not unusual. This causes even further problems.

Besides, there are also bimorph deflectable structures. Thermomechanic bimorph structures use, for instance, the different dilatation of materials by using heating structures, thereby exploiting the bimorph principle. Disadvantageously, however, the response is slow and high temperature differences may be used in order to achieve high deflections. Beyond this, the set of suitable materials is restricted. Another bimorph principle uses piezoelectric or electrorestrictive elements so as to deflect the deflectable element according to the bimorph principle. Here, dealing with the useful materials causes a problem since these materials hinder the usage of usual semiconductor fabrication processes. All in all, the production of such actuating structures is expensive. A solution to overcome the above identified problems is described in WO 2012 095185 A1. Here, electrostatic attraction between two electrodes forming a plate capacitor is used so as to deflect the deflectable element. The plate capacitor is arranged offset to the neutral of the deflectable element. The proximate electrode, i.e., the one arranged nearer to the neutral axis, and the distant electrode, i.e., the one arranged farther away from the neutral axis, are affixed to each other at segment boundaries so that applying a voltage between the electrodes results in the deflectable element deflecting owing to compressive and expanding lateral stresses manifesting themselves in the electrodes.

Unfortunately, even the manufacturing of micromechanical devices using the just outlined electrostatic bimorph actuator is demanding. Accordingly, it would be favorable to have concepts at hand which result in a more effective way of actively deflecting micromechanical devices.

SUMMARY

According to an embodiment, a micromechanical device may have: a deflectable element including a layer stack of a first layer and a second layer, wherein the first layer and second layer are mechanically fixed to each other by spacers so that the first layer is spaced apart from the second layer in a layer stack direction, wherein the spacers are inclined relative to the layer stack direction into a lateral direction, wherein the deflectable element is deflected along the lateral direction into or opposed to the layer stack direction by way of exposing the layer stack to an attractive force between the first layer and the second layer.

According to another embodiment, a micromechanical device may have: a deflectable element, wherein the deflectable element includes a laminar actuator which is formed as a layer stack including a distal layer and a proximal layer extending along and, in a deflection direction, spaced apart from a neutral axis of the deflectable element, wherein the proximal layer is arranged between the distal layer and the neutral axis and the layer stack is segmented into segments along a lateral direction, wherein the distal layer is mechanically fixed between the segments so that the distal layer is spaced apart from the proximal layer and so that the deflectable element is deflected along the lateral direction into or opposed to the deflection direction by way of exposing the layer stack to an attractive force between the proximal layer and the distal layer, wherein in each segment, a surface of the distal layer, facing the proximal layer via a gap, bulges out towards or away from the neutral axis wherein a ratio of half a length of the respective segment in the lateral direction to a difference between a maximum distance of said surface from the neutral axis and a minimum distance of said surface from the neutral axis lies between sin(1°) and sin(10°), both inclusively.

According to another embodiment, a micromechanical device may have: a deflectable element, wherein the deflectable element includes a laminar actuator which is formed as a layer stack including a distal layer and a proximal layer extending along and, in a deflection direction, spaced apart from a neutral axis of the deflectable element, wherein the proximal layer is arranged between the distal layer and the neutral axis and the layer stack is segmented into segments along a lateral direction, wherein the distal layer is mechanically fixed between the segments so that the distal layer is spaced apart from the proximal layer and so that the deflectable element is deflected along the lateral direction into or opposed to the deflection direction by way of exposing the layer stack to an attractive force between the proximal layer and the distal layer, wherein in each segment, the gap between the proximal and distal layer is non-planar and the deflectable element includes a surface facing away from the gap and conforming to the gap.

In accordance with a first aspect of the present application, a micromechanical element with an actively deflectable element is implemented using a layer stack which, upon application of attractive forces between the layers, provokes the deflection. In accordance with the first aspect, however, the attractive force is turned into a deflection of the beam directly rather than via a detour according to which the attractive forces are firstly turned into lateral stresses developing in the layers which, by offsetting the layers relative to a neutral axis of the deflectable element, deflect the deflectable element. In particular, to this end, spacers between the layers are inclined relative to a layer stack direction. Attractive forces between the layers bend the spacers thereby resulting in two opposed stress gradients manifesting themselves at the interfaces between spacers and layers all along the lateral direction with these opposed stress gradients finally bending the deflectable element. Owing to the fact that the lever arm in form of a distance from a neutral axis is not necessary, the stiffness of the deflectable element may be selected more freely.

In accordance with a second aspect of the present application, the concept of using a laminar actuator of a deflectable element of a micromechanical device, the layer stack being arranged offset to a neutral axis of the deflectable element so as to deflect the deflectable element by exposing the layer stack to an attractive force between its proximal and distal layers, is rendered more effective in terms of achievable deflection amount at a certain attractive force being applied between the layers, by forming each segment into which the layer stack is segmented along a lateral direction in a predetermined way. In particular, in each segment, a surface of the proximal layer which faces the distal layer by a gap between proximal and distal layer, bulges out towards or away from the neutral axis, wherein a ratio of half a length of the respective segment in the lateral direction to a difference between a maximum distance of said surface from the neutral axis and a minimum distance of said surface from the neutral axis lies between $\sin(1°)$ and $\sin(10°)$, both inclusively. Choosing "slope angle" for each bulge/segment results in an effective exploitation of the deflection of the deflective element responsive to the attractive forces between proximal and distal layers.

In accordance with a third aspect of the present application, the concept of using a laminar actuator of a deflectable element of a micromechanical device, a laminar actuator being arranged offset from the neutral axis of the deflectable element so as to deflect the deflectable element responsive to an exposure of the layer stack to an attractive force between its proximal and distal layers, is rendered more effective in terms of deflection amount responsive to the exposure to an attractive force between proximal and distal layers by forming, in each segment, the gap between the proximal and distal layer in a non-planar manner and providing the deflectable element's surface facing away from the gap with a shape conforming to the gap. This "conformity" turns out to maintain the stiffness of the deflectable element on the one hand, but increase the achievable deflection amount upon application of a predetermined attractive force between proximal and distal layers on the other hand.

In accordance with all aspects, the layer stack may form a plate capacitor with the proximal or the first layer forming a proximal electrode of the plate capacitor and the distal or the second layer forming a distal electrode. That is, electrostatic attraction between electrodes may be used for the deflection. Alternatively, the layers may be structured so as to form spirals or coils and by applying current to these spirals or coils a magnetic attraction between the layers may be caused, thereby achieving the deflection of the deflectable element.

In accordance with an embodiment associated with a first aspect, each spacer may be formed of insulating material for isolating the layers from one another, wherein each spacer also be formed of a conductive material of the distal and proximal layers, wherein the conductive material extends up into the spacers so as to abut, within the spacers, on the insulating material along a surface which, when exposing the layer stack to attractive force, crosses a tensile stress field developing in the spacers due to the attractive force perpendicularly and is in parallel to a compressive stress of a compression field in the spacers developing in the spacers due to the attractive force. Choosing the interface between both materials along the just outlined surface increases the mechanical stability of the contact between the layers and the spacer.

In accordance with an embodiment associated with a first aspect, the conductive material of the layers may be interdigitated with insulating material of the spacers at ends of the spacers facing the distal and proximal layers, respectively, i.e., at the interfaces therebetween. Thereby, the delamination probability is reduced.

In accordance with an embodiment associated with any of the above outlined aspects, the electrostatic force achievable between the layers when acting as electrodes of a plate capacitor, is increased by providing the layers with protrusions which protrude into the gap between layers so as to interdigitally engage with each other. In case of using the inclined spacers according to the first aspect, the protrusions may, in accordance with a further embodiment, be formed such so that same protrude substantially in parallel to each other and in a direction substantially transverse to a relative direction along which portions of the layers from which the protrusions protrude, move relative to each other responsive to the exposition of the layer stack to the attractive force.

The bulging-out of the gap of the segments in accordance with the second aspect may be such that the distal layer's surface facing the neutral axis bulges-out in a rounded, angled or stepped manner. In accordance with embodiments associated with the second aspect, the gap between the proximal layer and the distal layer—or the interface between the gap and the distal layer—may be formed of plane portions and ramp portions exclusively, with the plane portions extending in parallel to the neutral axis and the ramp portions being inclined relative to the neutral axis. Advantageously, the angle of inclination of the ramp portions may be chosen so as to coincide with angles between crystal planes of the material of the deflectable element. By this measure, the manufacturing may be alleviated tremendously.

Naturally, it is possible to combine the above mentioned aspects, i.e., to implement micromechanical devices taking advantage of more than one of the aspects outlined above.

BRIEF DESCRIPTION OF THE DRAWINGS

Embodiments of the present invention will be detailed subsequently referring to the appended drawings, in which:

FIG. 25 shows a side view of a micromechanical device modified compared to the embodiment of FIG. 13 in that an insulator film is at least partially provided within the gaps' inner surface so as to prevent short circuiting between both layers in case of the attractive force exceeding some threshold, with this possibility of providing an insulating film being, however, also applicable to all of the other embodiments outlined above.

DETAILED DESCRIPTION OF THE INVENTION

Before starting with the description of embodiments of the present application in accordance with various aspects of the present application, comparison embodiments of micromechanical devices are described so as to form a reservoir of possible variations in implementing the layer stack which is commonly used in accordance with the subsequently explained embodiments of the various aspects. It is to emphasized, however, that the deflection principle on which these comparison embodiments are based, differs from the principle being the subject of embodiments of the first aspect. Nevertheless, the structural variations of the comparison embodiments as far as the layer stack and the spacers and the gap therebetween is concerned shall be applicable so as to vary embodiments described later with respect to the first aspect, irrespective of the other elements shown in these figures and not occurring in the first aspect's embodiments. With respect to the embodiments of the second and third aspect, the comparison embodiments yield a reservoir of common structures and behaviors so that the description of the embodiments of the second and third aspects is the focused onto explaining the differences and advantages of these embodiments relative to the comparison embodiments. A common concept underlying all micromechanical devices described hereinafter is the fact that same comprise a layer stack which, upon application of an attractive force onto the layers, deflects. It is emphasized that the description of the figures sometimes assume that electrostatic attraction is used for attracting the layers although the description brought forward in the following may be easily transferred to other concepts and embodiments according to which the attractive force between both layers may be achieved in accordance with a different physical principle such as, for example, by creating magnetic forces between both layers. Accordingly, although the description of the figures sometimes refers to "electrodes," these terms may be easily transferred to "layers," with changing this specific description to alternatives where a different physical principle is used so as to create the attractive force.

FIG. 1 shows a micromechanical device representing a kind of "intersection" of the embodiments described subsequently. FIG. 1a is used so as to illustrate the common concepts of the subsequently described embodiments.

Figure 1A:
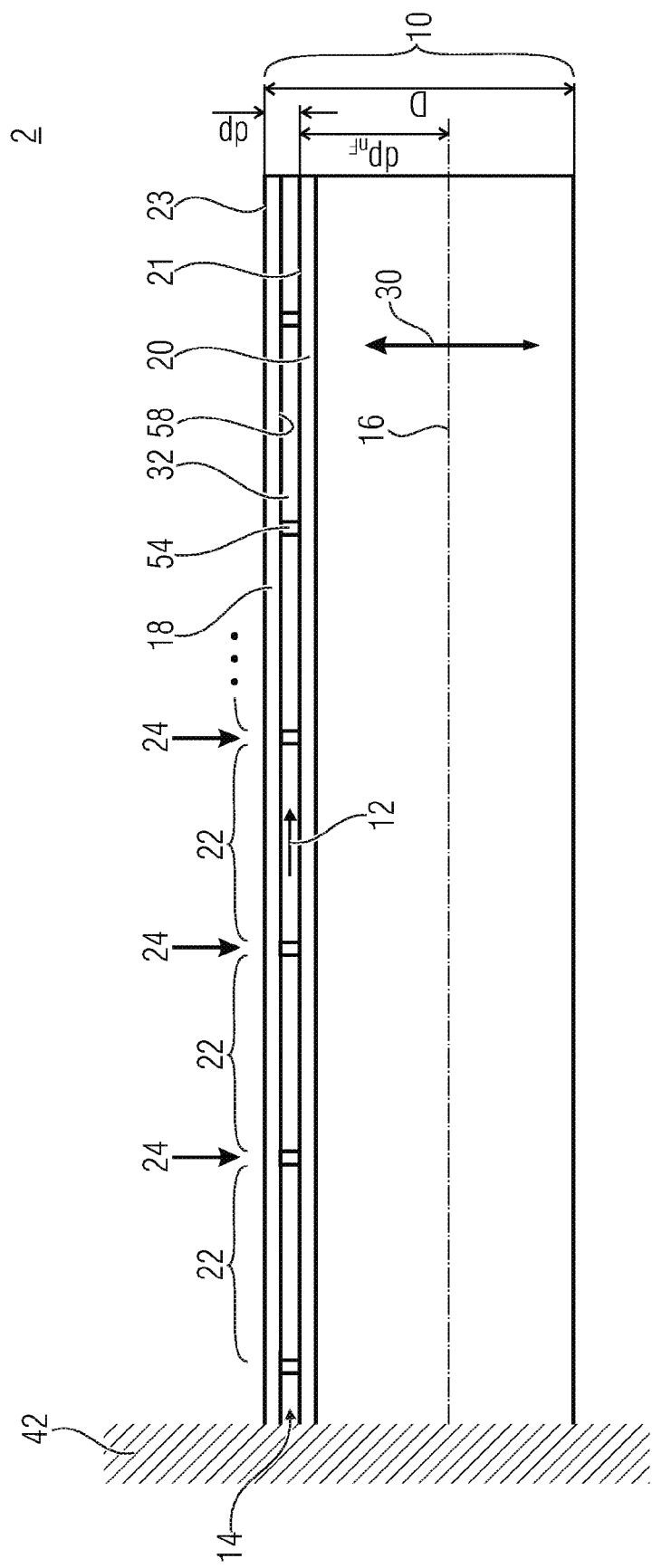
FIG. 1a shows a side of a micromechanical device in accordance with a comparison embodiment, the device being provided with a laminar actuator offset to a neutral axis of the micromechanical device's deflectable element and being segmented into segments along a lateral direction with the distal layer being fixed at segment boundaries between the segments.

The micromechanical device of FIG. 1a is generally indicated using reference sign 2 and comprises a deflectable element 10 comprising a laminar actuator which, in the case of FIG. 1a, is exemplarily embodied as a plate capacitor 14 extending along, and spaced apart from, a neutral axis 16 of the deflectable element 10. The plate capacitor 14 comprises a distal layer 18 forming a distal electrode of the plate capacitor 14, and a proximal layer 20 forming a proximal electrode of the plate capacitor. The distal electrode 18 is arranged on a side of the plate capacitor 14, facing away from the neutral axis 16, whereas the proximal layer 20 is arranged between the distal layer and the neutral axis 16. The plate capacitor 14 is, along a lateral direction 12, segmented into segments 22. The distal layer 18 is mechanically fixed between segments 22, namely at segment boundaries 24. In case of applying a voltage onto the plate capacitor 14, the deflectable element 10 experiences a deflection along the lateral direction 12 owing to a principle similar to the bimorph principle, namely a deflection into a direction 30 along which the plate capacitor 14 is distanced from the neutral axis 16, i.e., a direction 30 transverse to, or perpendicular to, the plate capacitor 14. As to whether the deflective element 10 is deflected downward or upward in FIG. 1a, i.e., whether the application of a voltage to the plate capacitor 14 results in a deflection so that the element's 10 curvature in the plane of the plate capacitor 14 is tighter or less tight than when compared to the curvature at the neutral axis 16, depends on the design of the plate capacitor, such as a design of the gap 32 between layers 20 and 18 and the design of layers 18 and 20, respectively.

Differently speaking, the deflectable element 10 is composed of layers. The layer stack direction coincides with direction 30. Measured along this direction 30, the plate capacitor 14 advantageously occupies merely a small fraction of the overall thickness of the deflectable element 10. For example, let $d_P$ denote the distance between a distant surface 21 of the proximal electrode 20, i.e., the surface facing the distal layer 18, and the outer or distal surface 23 of the distal layer 18. Then, $d_P$ may be less than ⅕ or even less than 1/20 of the overall thickness D of the deflectable element 10. By this measure, the distance $d_P$ nF between the neutral axis 16 and the proximal layer's 20 distal surface 21 is relatively large and is, for example, greater than 80% of D/2, so that the lateral expansion stress or lateral compression stress effectively generated in the plate capacitor 14 when applying the voltage thereto acts onto the deflectable element with a relatively large lever length substantially corresponding to $d_P$ nF, thereby effectively bending/deflecting the deflectable elements 10 along direction 30.

As already mentioned above, the plate capacitor 14 is, along the lateral direction 12, segmented into segments 22. Between segments 22, i.e., at the segment boundaries 24, distal and proximal layers 18 and 20 are mechanically affixed to each other. In each segment 22, layers 18 and 20 are separated from each other via the gap 32. Gap 32 could be, or instance, an air gap, i.e., filled with air, or could be filled with material which is soft compared to the other materials of the deflectable element 10. Alternatively, the gaps 32 could be laterally closed cavities filled with, for example, vacuum.

Figure 1B:
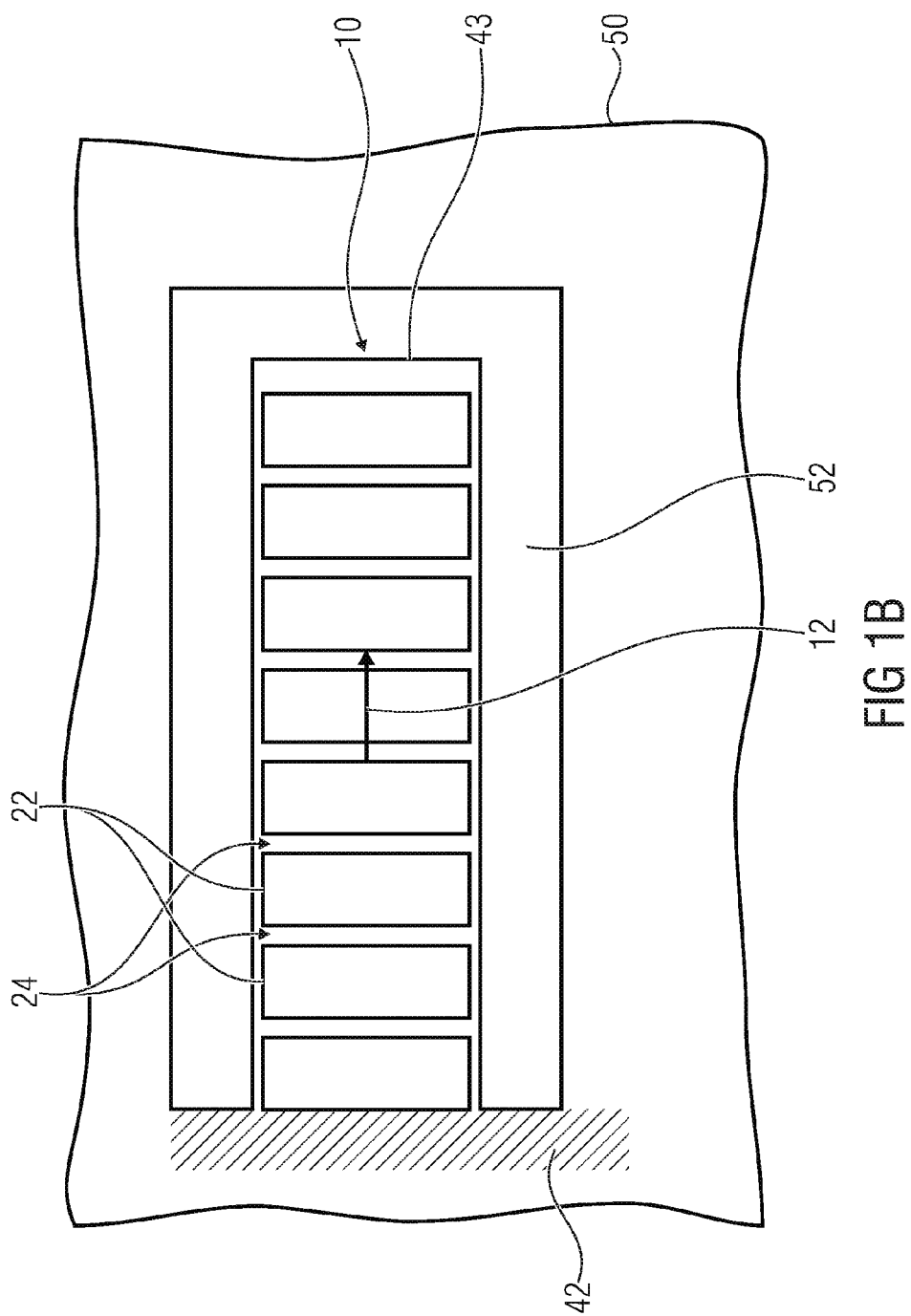
FIG. 1b shows exemplarily how to implement a micromechanical device shown in FIG. 1a as an out-of-plane actuator, the deflection of which results in the deflectable element curling out of the substrate's plane, with this possibility also being applicable to all of the other micromechanical devices shown in all other figures besides FIG. 1c.

The deflectable element of FIG. 1a may, for instance, be formed as a beam such as, for example, a single-suspended cantilever. FIG. 1b illustrates a plan view of the micromechanical device 2 of FIG. 1a for this example. That is, the deflectable element 10 is formed as a cantilever longitudinally extending along the lateral direction 12, along which the segments 22 are consecutively arranged, from a suspension 42 towards a free end 43 of cantilever 10. FIG. 1b shows that the segments 22 and segment boundaries 24 longitudinally extend along a lateral direction transverse to, or perpendicular to, direction 12. For instance, they may be formed straight. FIG. 1b also illustrates the possibility that the deflectable element 10 may be formed "in-plane." That is, the deflectable element is, in accordance with the example of FIG. 1b, formed of a part of a substrate 50 which is bordered, except for at least the suspension side 42 of the deflectable element 10, by an opening 52 which is continuous in a substrate thickness direction, i.e., the opening 52 is a through completely extending through the thickness of substrate 50. Here, in the case of FIG. 1b, the direction 30 of deflection shown in FIG. 1a coincides with the substrate thickness direction. That is, the deflection of the deflective element 10 is an "out of plane" deflection; it deflects out of the plane of substrate 50.

Figure 1C:
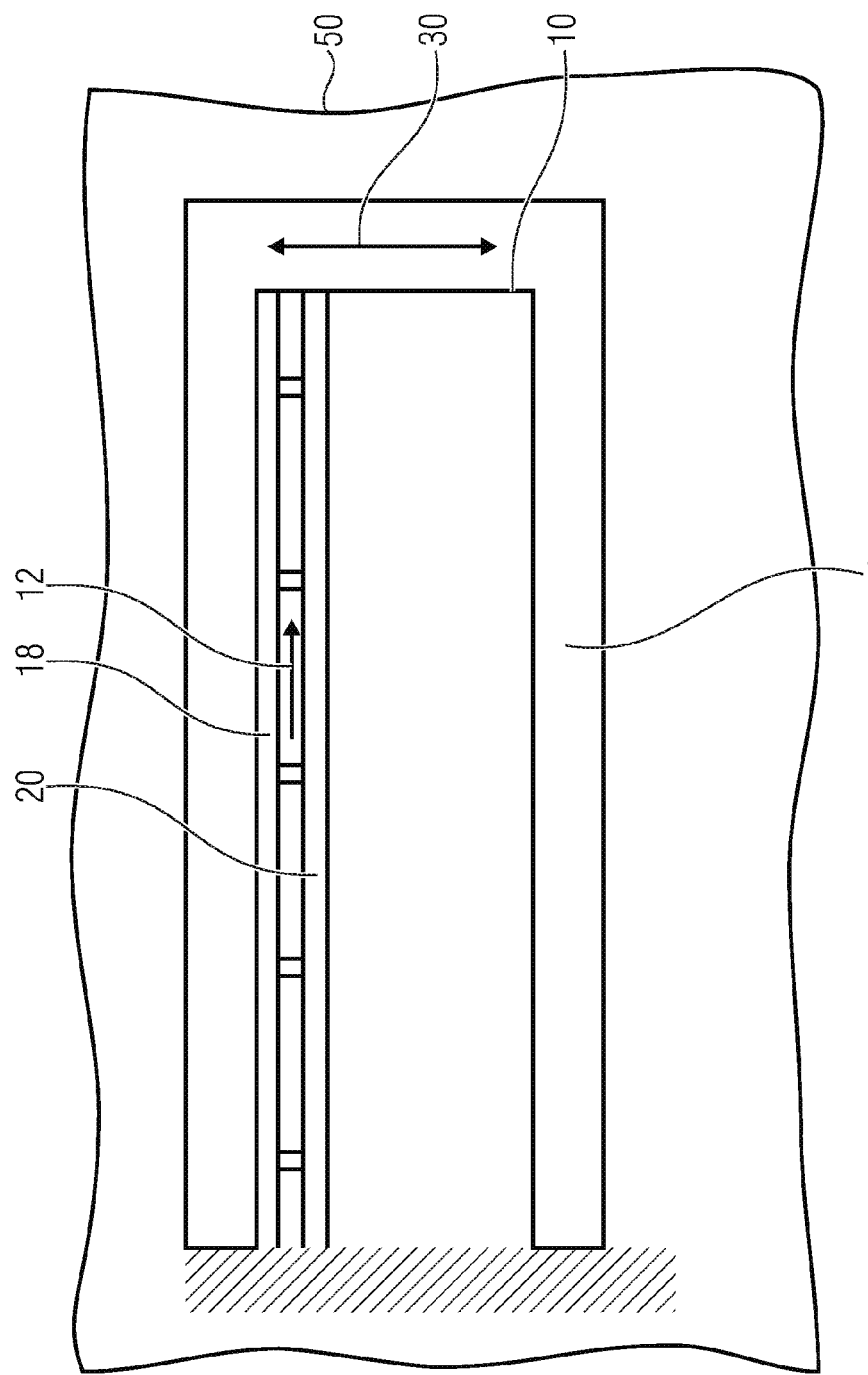
FIG. 1c shows a plan view onto a substrate in order to illustrate a possibility so as to implement the micromechanical device of FIG. 1a as an in-plane actuator, with this possibility likewise being applicable to all of the subsequently explained micromechanical devices.

FIG. 1c shows an alternative with respect to FIG. 1b, according to which the deflective element 10 is formed of a part of the substrate 50 such that the deflection direction 30 is lateral with respect to substrate 50. That is, layers 18 and 20 are, in the case of FIG. 1c, formed perpendicular to the lateral extension of substrate 50 and lateral direction 12 and deflection direction 30 both run laterally, span the substrate's 50 extension direction.

Many variations are possible with respect to the micromechanical device of FIGS. 1*a* to 1*c*. All of these variants including those already discussed above with respect to FIGS. 1*a* to 1*c* are also feasible with respect to the subsequently explained embodiments of the present application and are accordingly discussed now before presenting the embodiments of the present application.

For example, FIG. 1*a* illustrated that the distal layer 18 is mechanically fixed between the segment 22, namely at the segment boundaries 24, in a manner so that the distal and proximal layers are insulated from each other by spacers 54 of an insulating material. The spacers 54 may have been obtained by structuring an insulating layer between proximal and distal layers 20 and 18. That is, they may represent residua of structuring an insulating layer separating layers 18 and 20. The insulating spacers 54 accordingly extend between distal and proximal layers 18 and 20 and are laterally distributed along the lateral direction 12 so as to be laterally positioned between segments 22 at the segment boundaries 24. However, for various reasons, it might be advantageous to not have to structure an insulating layer on top of the proximal layer's 20 distally facing surface 21. For example, structuring steps may negatively affect the flatness of surface 21 in terms of its nano structure roughness. That is, the nano scale roughness resulting from such structuring may lead to voltage peaks manifesting themselves when applying a voltage between layers 18 and 20 due to nano protrusions protruding into gap 32.

Figure 1D:
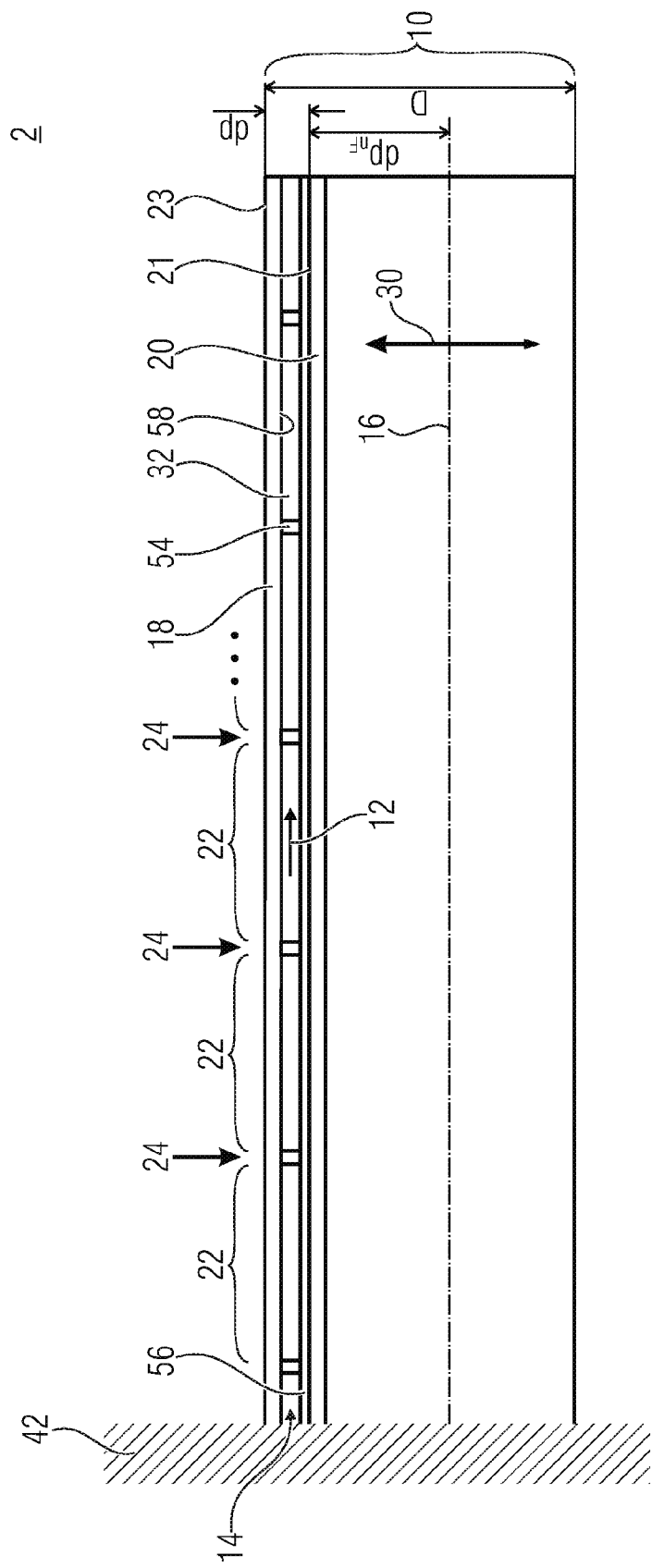
FIG. 1d shows a side view of a micromechanical device modified relative to FIG. 1a with respect to the position of a continuous insulation layer serving to isolate the layers of the laminar actuator, with this possibility also being applicable to all of the other subsequently explained micromechanical devices.

FIG. 1*d*, for instance, shows an example where the spacers 54 may be insulative or conductive or may be formed of, for example, the same material as the material of the distal layer 18. In particular, in accordance with the example of FIG. 1*d*, the spacers extend between the distal layer and the proximal layer 18 and 20, are laterally distributed along the lateral direction 12 so as to be laterally positioned between segments 22, and are isolated from at least one of the distal and proximal layer 20 and 18, respectively. In particular, in accordance with the example of FIG. 1*d*, an insulative film 56 is formed on top of proximal layer's 20 distally facing surface 21 so that the spacers 54 are based on, i.e., have their footprint on, the insulator film 56. Advantageously, insulative film 56 may be continuously formed along the segment direction 12 just as the proximal layer 20 and distal layer 18 in FIGS. 1*a* to 1*d* may do. Naturally, the insulative film 56 may alternatively or additionally be formed on top of the proximally facing surface 58 of the distal layer 18, i.e., the surface facing the proximal layer 20.

Figure 1E:
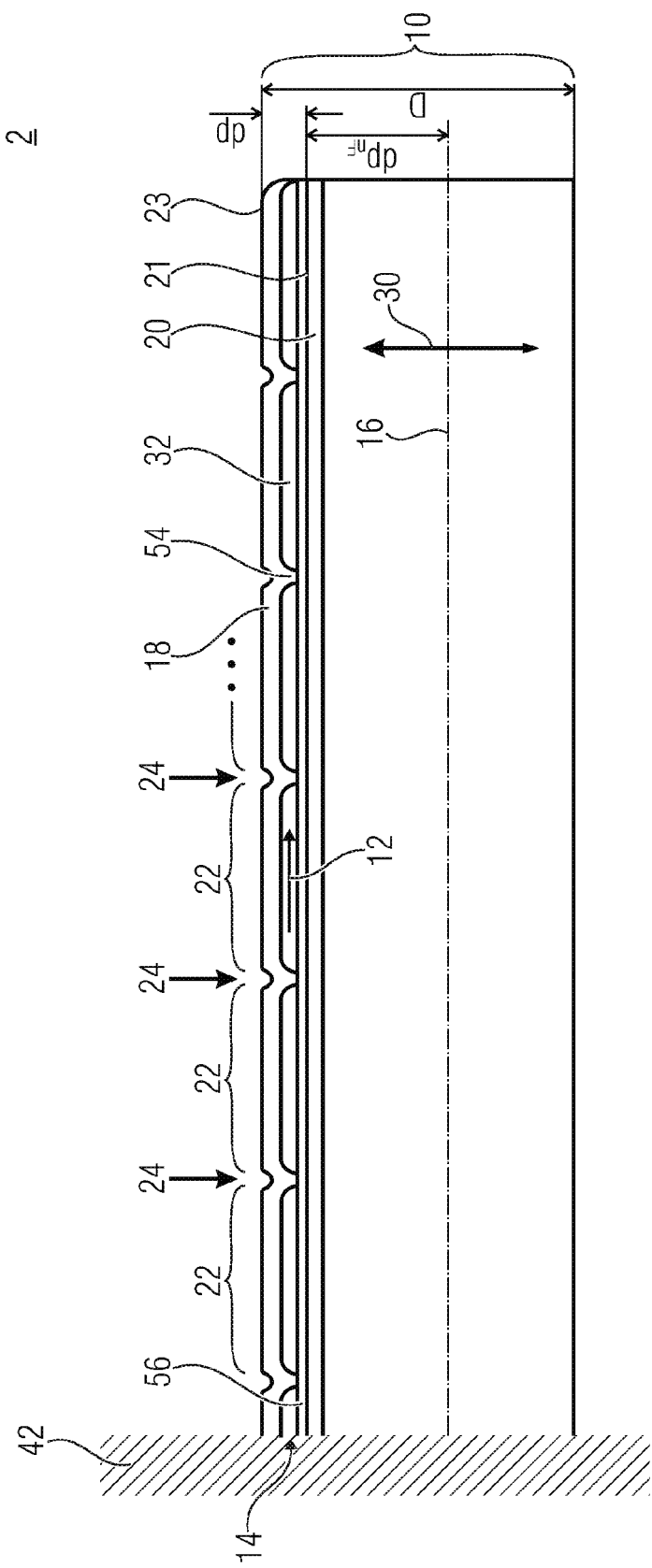
FIG. 1e shows a side view of a micromechanical device modified relative to FIG. 1d in that the spacers form integral portions of the distal layer rather than separate elements, with this possibility likewise being transferable onto subsequently explained embodiments.

FIG. 1*e* shows a further variant of FIG. 1*d*. In particular, FIG. 1*e* illustrates that spacers 54 do not necessarily need to be extra elements formed in addition to layers 18 and 20. Rather, they may be formed integrally with, or may themselves form an integral part of, one of layers 18 and 20. FIG. 1*e*, for example, illustrates that the spacers 54 are actually bulges in the distal layer 18, bulging towards the proximal layer 20 so that the distal layer is fixed to, i.e., based on, the proximal layer 20. In order to maintain the insulation between proximal and distal layers, the insulative film 56 formed on top of the proximal layer's distally facing surface 21 insulates the proximal layer 20 and distal layer 18 from each other. For example, in forming the "spacer bulges" 54, the distal layer 18 may have been formed by conformal deposition of the distal layer's material onto a sacrificial layer structured to keep free the volume later forming the gaps 32 between the proximal layer 20 and the distal layer 18, but having voids at the segment boundaries 24 where the distal layer 18 is to be affixed. Theoretically, the spacers could be made an integral part of upwardly bulges of the proximal layer.

Figure 1F:
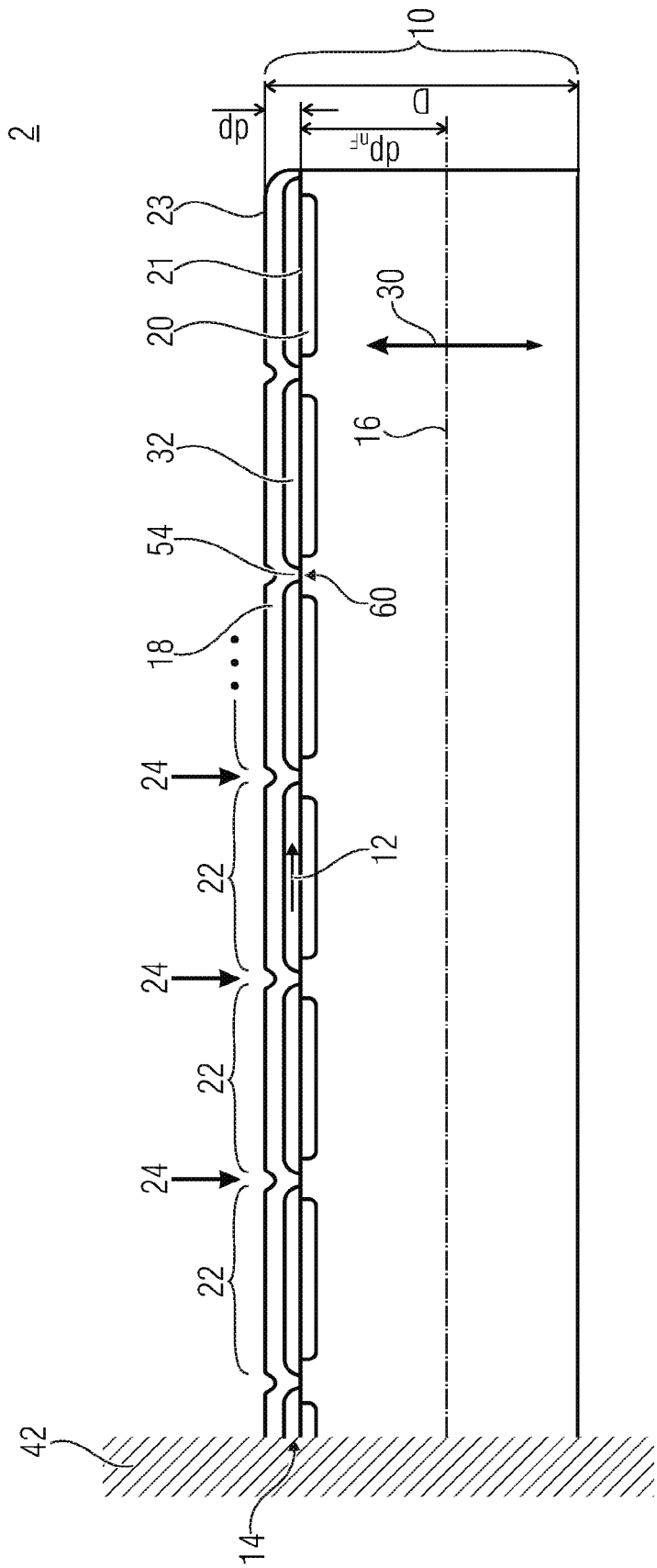
FIG. 1f shows a side view of a micromechanical device modified relative to FIGS. 1d and 1e so as to illustrate a further possibility as to how to ensure the isolation between the layers of the laminar actuator, namely by structuring here exemplarily the proximal layer, with this alternative way of achieving the isolation likewise being applicable to subsequently explained embodiments.

FIG. 1*f* illustrates an alternative according to which the insulation between the proximal layer and distal layer is achieved in a different manner than when compared to the continuous insulating film 56. In particular, here the proximal layer 20 is formed discontinuously rather than continuously in segment direction 12. In particular, the proximal electrode 20 comprises voids 60 at the segment boundaries 24 so that the distal layer 18 is fixed at the segment boundaries 24 to an insulating material of the deflectable element at the voids 60. That is, the majority of the deflectable element 10 of FIG. 1*f* is, for example, formed of insulative material so that the distal layer 18 is affixed by way of spacers to the insulating material of the deflectable element.

While FIG. 1*f* illustrates the case that the insulating material of the deflectable element may extend, at the voids 60, between the portions of the proximal layer 20 opposing the distal layer 18 via the respective segment's 22 gap 32 so as to result into a substantially planarized surface including the distally facing surface 21 of the proximal layer's 20 segment portions, the proximal layer 20 may have simply been deposited on a main surface of the deflectable element's 10 deflection body, such as a beam or membrane, with then having been structured so as to result in voids 60. In that case, the proximal layer 20 would be formed on a main surface 62 of the main body 64 of the deflectable element 10 with the void 60 structured thereinto so as to leave one portion of proximal layer 20 for each segment 22. Spacers 54 would then extend, in layer stack direction 30, between these portions of proximal layer 20 so as to touch, and being affixed to, the deflectable element's 10 main body 64, which as mentioned above may be formed of insulative material so that proximal and distal layers may be isolated from each other. The portions of the proximal layer 20 associated with each of segments 22 may be electrically connected to each other, i.e., may be short circuited via a conductive line running along the segment direction 12. The voids 60 in the proximal layer 20 would be wider in lateral direction 12 than compared to a width of spacers 54 so that the spacers 54 would "submerge" into the voids 60 of the proximal layer 20 laterally distanced with lateral gaps 64 from the segment portions of the proximal layer 20.

Figure 1G:
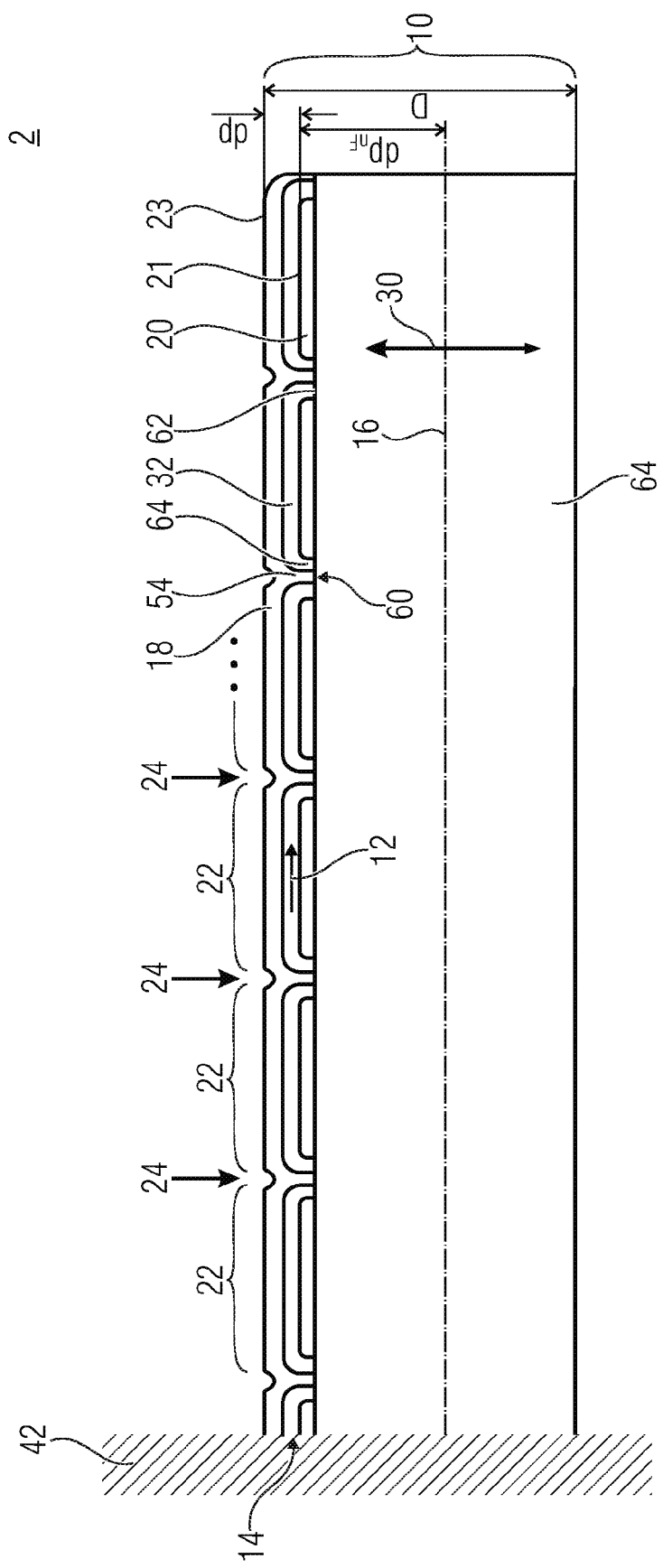
FIG. 1g shows a side view of a micromechanical device modified relative to FIG. 1f in that the remaining portions of the proximal layer protrude from the main body's main surface rather than being formed flush with respect to the latter surface, with this modification also applicable to embodiments of the present application.

While in the embodiment of FIG. 1*g*, the major part of the deflectable element 10, i.e. the main body 64, was described to be composed of insulative material, this does not need to be the case in the examples depicted in FIGS. 1*a* to 1*f*. Even in the case of FIG. 1*g*, a continuous insulative film may, alternatively, be formed on the main body's 64 main surface 62, for example.

Thus, in the embodiments described above, the activation of the lateral actuator, i.e., the activation of the plate capacitor 14 by applying a voltage between its electrodes 18 and 20, results in attractive forces between layers 18 and 20, which in turn provoke lateral stresses in layers 18 and 20. These lateral stresses are substantially continuously developed along direction 12 and, owing to the plate capacitor's 14 distance from the neutral axis 16, these lateral stresses finally bend the deflectable element 10. In accordance with embodiments of the first aspect of the present application described in the following, a part of the stress development, which results in the element's 12 deflection along direction 30, is shifted from layers 18 and 20 towards the spacers 54.

To be more precise, the substantially continuous development of lateral stresses in layers 18 and 20 and the application of these stresses via the lever arm formed by the separation from the neutral axis is no longer the source for deflection. Rather, the spacers 54 are inclined relative to the gap normal so as to locally generate opposite stress gradients in both layers at the portions where spacers 54 are based on the layers so that these opposite stress gradients occurring at each spacer finally end up into the bending of the deflectable element. In accordance with the embodiments of the first aspect, the offset of layers 18 and 20 from the neutral axis of the deflectable element is no longer necessary. Rather, layers 18 and 20 themselves form the major part of material of the deflectable element.

Figure 2:
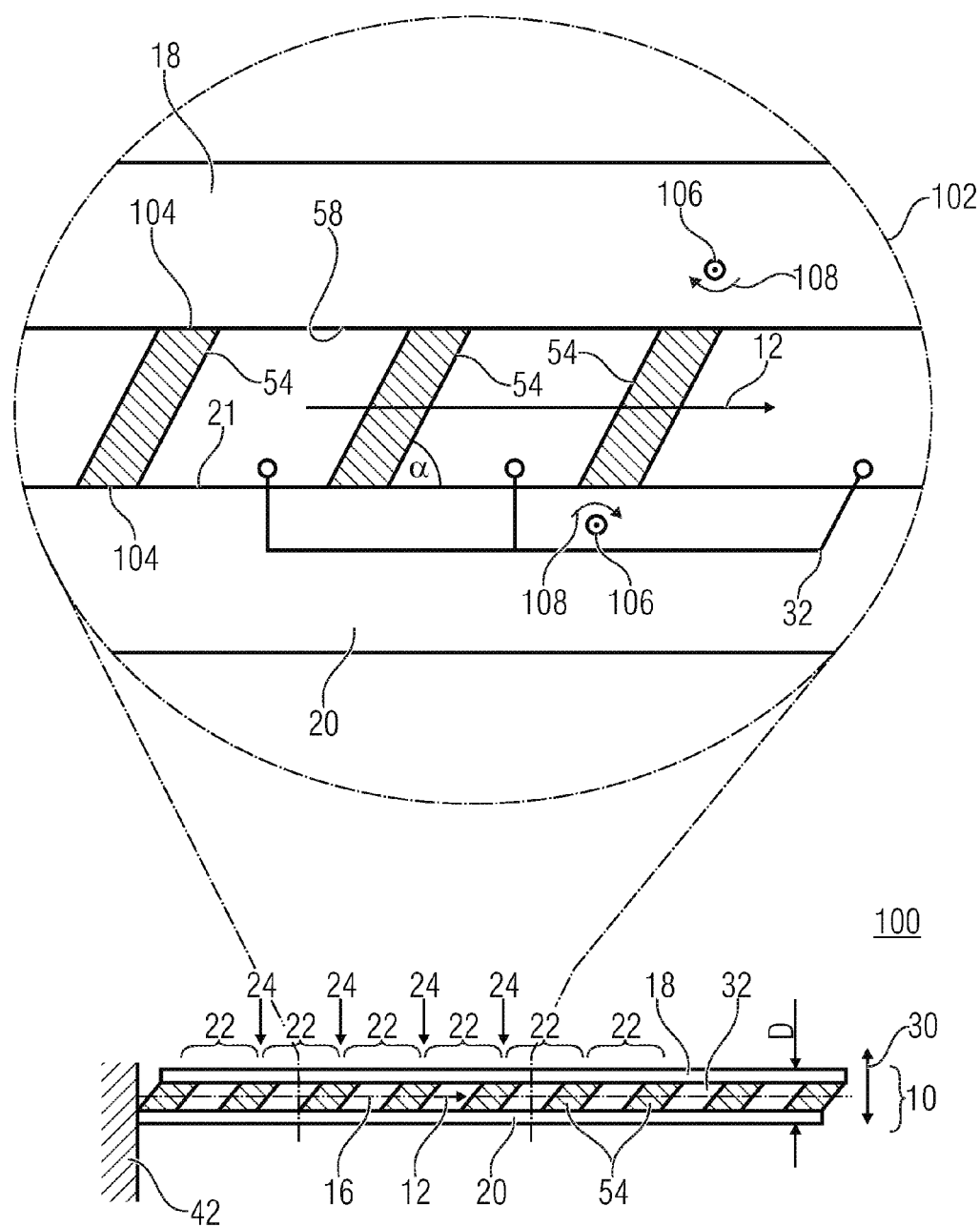
FIG. 2 shows a side view of a micromechanical device in accordance with an embodiment of a first aspect of the present application according to which the laminar actuator structure of the comparison embodiments of FIGS. 1a to 1g is modified in that the spacers are inclined, and in that the laminar actuator itself forms the deflectable element, with the deflection action being provoked also by attractive forces, but in a different manner.

FIG. 2 shows a first embodiment of a micromechanical device 100 in accordance with an embodiment of the first aspect of the present application. The micromechanical device of FIG. 2 comprises the deflectable element 10 which comprises, or is formed of, in turn a laminar actuator which is formed as a layer stack comprising a first layer 18 and a second layer 20. The layer stack is segmented into segments along lateral direction 12. In particular, the first layer 18 and the second layer 20 are mechanically affixed to each other between the segments 22 at segment boundaries 24 by spacers 54 so that the first layer 18 is spaced apart from the second layer 20 in deflection direction, which coincides with the layer stack direction of the layer stack. As far as the plan view of the micromechanical device of FIG. 2 is concerned, the same as mentioned above with respect to FIGS. 1b and 1c holds true. That is, the deflectable element 10 may form a beam or a cantilever suspended at one end at a suspension 42.

Although FIG. 2 suggests that the deflectable element is suspended or affixed to suspension 42 with one of layers 18 and 20 only, namely layer 20 in the case of FIG. 2, it should be noted that this situation could be changed in an alternative embodiment, i.e., both layers 18 and 20 could be affixed to suspension 42.

Differing from the explanations brought forward above with respect to FIGS. 1a to 1g, however, the deflectable element 10 of FIG. 2 has its neutral axis 16 positioned between layers 18 and 20. That is, in FIG. 2, the deflectable element's thickness D substantially corresponds to the sum of thickness of layer 18, layer 20, and the gap 32 between both layers 18 and 20, i.e., no main member 64 forms a major part of the material of the deflectable element 10. The thicknesses of layers 18 and 20 may be the same as exemplarily illustrated in FIG. 2, so that the neutral axis 16 of the deflectable element 10 would run centrally therebetween, but different possibilities exist as well. It may even be imaginable that the neutral axis 16 runs outside gap 32 within one of layers 18 or 20, which is then, for example, formed thicker than the other layer, or beyond one of layers 18 and 20 with this layer being formed on a main body similar to 64 of FIGS. 1a to 1g. As described later on, the micromechanical device of FIG. 2 is actuated in a manner similar to the devices shown with respect to FIGS. 1a to 1g, namely by exposing layers 18 and 20 of the layer stack to attractive forces. For example, layers 18 and 20 may, as described above, form the electrodes of a plate capacitor. All of the other alternatives described above and described further below hold true with respect to FIG. 2 as well. Further, although specific details with respect to the spacers are described further below, all of the alternatives described above with respect to FIGS. 1a to 1g as far as the different possibilities as to how to affix layers 18 and 20 to each other in a manner electrically insulated from each other, are also applicable in order to form alternative embodiments out of FIG. 2 and the subsequently described explicit embodiments of the first aspect of the present application.

As shown in FIG. 2 and shown in an exaggerated manner in portion 102 of FIG. 2, the spacers 54 of the micromechanical device 100 of FIG. 2 are inclined relative to the gap normal of the gap 32 between the first and second layers 18 and 20. By this measure, the deflectable element 10 is deflected along the lateral direction 12 into or opposed to the deflection direction 30 by way of exposing the layer stack to an attractive force between the first and second layers 18 and 20. The reason is the following. As described, spacers 54 attach layers 18 and 20 to each other at intermittently occurring sites 104 of the surfaces 58 and 21 of layers 18 and 20, facing each other. Since the spacers 54 are inclined relative to the gap normal 30 of gap 32 into the lateral direction 12 along which spacers 54 are distributed, the sites 104 at which the spacers 54 are based on layer 18 are offset with respect to the sites 104 at which spacers 54 are based on layer 20 along lateral direction 12. Owing to the inclination forming, for example, an angle α in a plane spanned by the lateral direction 12 and the layer stack direction 30, the spacers 54, though being stiff, experience some sort of deflection upon activating the attractive force between layers 18 and 20, which deflection in turn provokes stress fields in layers 18 and 20 at the sites 104 at which the spacers 54 are attached to layers 18 and 20, respectively. Owing to the inclination, however, these stress fields are opposite to each other along direction 12. This opposite characteristic of the stress fields induced by the deflection of the spacers 54 at sites 104, in turn, add-up along direction 12 so as to deflect the deflectable element 10 along direction 30. In particular, at each site 104, the respective spacer 54 tends to locally rotate the respective layer around an axis 106 laterally extending transverse to lateral direction 12 in a rotation direction 108 leading from the opposite angle 180°−α to the inclination angle α, which is an acute angle. Notably, owing the stiffness of the spacers and the stiff interface between spacers and layers, the angle at which spacers 54 protrude from layers 18 and 20 remains α—at stress-free situation—without voltage applied—and at stress-imposed situation—with voltage applied. By this measure, the deflectable element 10 is bent per spacer 54, the bending ends up along the lateral direction 12 so as to yield an overall deflection of the deflectable element into direction 30, which in the case of FIG. 2 leads from top to bottom owing to the fact that the spacers 54 are inclined towards the right hand side.

Figure 3:
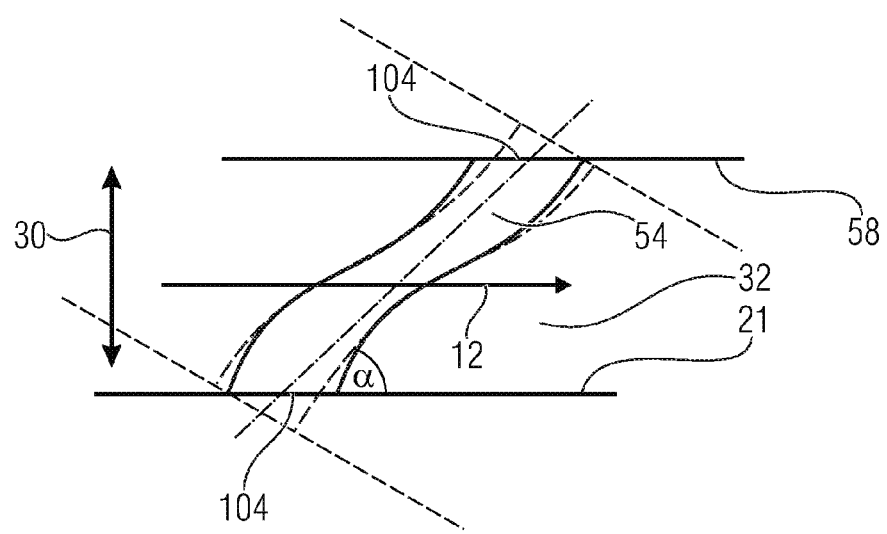
FIG. 3 shows a schematic diagram illustrating using continuous lines a spacer of the micromechanical device of FIG. 2 in activated state and, using dashed lines, in a posture the spacer 54 tends to assume, thereby achieving the deflection of the micromechanical device of FIG. 2.

In order to, in a simplified manner, explain the deflection action of the deflectable element of FIG. 2 upon application of the attractive force between the first and second layers, reference is made to FIG. 3 which shows one spacer 54 attached between the first layer's surface 58 and the second layer's surface 21 and bridging, in an inclined manner, the gap 32 between surfaces 58 and 21. The inclination angle α according to which spacers 54 are tilted from the layer stack direction 30 into lateral direction 12 is depicted. FIG. 3 shows, however, the situation in case of the attractive force being exerted onto the first and second layers. Accordingly, spacer 54 is shown as being deflected in a kind of S-shape, the spacer 54 induces stresses within the first and second layers at the sites 104 at which spacer 54 is attached to surface 58 and 21, which tend to re-award spacer 54 its shape it has without the attractive force being exerted onto the first and second layers. As shown by dotted lines in FIG. 3, this tends to rotate surfaces 58 and 21 (the first and second layers) at sites 104 locally into the same rotation direction as the inclination angle α. In other words, in the case of FIG.

3, for example, the lateral direction 12 points from left to right. In the case of FIG. 3, spacer 54 tilts over into this direction. Spacer 54 is inclined at angle α with respect to surface 21 and inclined at angle α with respect to surface 58. Upon exerting the attractive forces, the bending of spacer 54 seeks to locally bend the first and second layers such that the respective surface 58 and 21, respectively, at site 104 is rotated into the tilt over rotation direction, i.e., clock-wise in the case of FIG. 3. That is, the micromechanical device of FIGS. 2 and 3 acts in a manner different compared to the structures shown with respect to FIGS. 1a to 1g, even though structural similarity led to the usage of the same reference signs in FIGS. 2 and 3 compared to FIGS. 1a to 1g. It should be noted that in FIGS. 2 and 3 layers 18 and 20 are continuously formed. They may even be formed planar, thereby resulting in a planar gap 32. In particular, layers 18 and 20 may be parallelepiped shaped and accordingly may be separated from each other by a substantially parallelepiped shaped gap 32 intermittently interrupted, however, in the lateral direction 12 by spacers 54, which are tilted around a lateral direction transverse to, or perpendicular to, the lateral direction 12 at the inclination angle. The spacer 54 may also be formed in a parallelepiped shape as depicted in FIGS. 2 and 3, but a variation thereof may very well be possible. For example, the spacers 54 may be formed at individual cylinders. As soon as the attractive force urges together layers 18 and 20, the resulting pressure generates the aforementioned two opposed stress gradients all along the length of layers 18 and 20 along direction 12 that will bend the deflectable element 10. In line with FIG. 1b, the micromechanical device can be implemented to achieve an out-off plane movement of the deflectable element 10. However, an in-plane movement according to FIG. 1c is also achievable.

Figure 4:
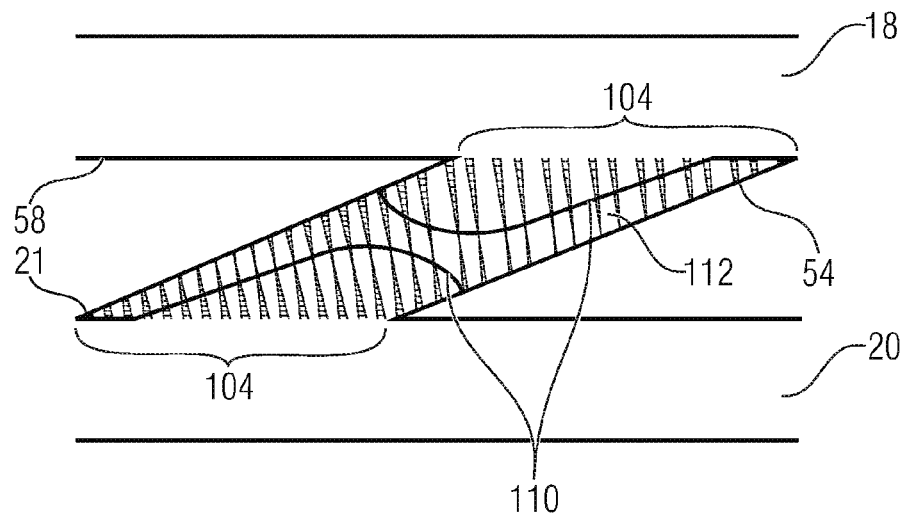
FIG. 4 shows a side view of a spacer of a micromechanical device according to FIG. 2 in accordance with an embodiment according to which materials of the layers and the insulative material of the spacer interface each other along a surface aligned with respect to a stress field inside the spacer as induced by exerting the attractive force between the layers.

It is to be expected that in the embodiment of FIGS. 2 and 3, huge shearing stress is created in the area of the spacer 54. A stress field is shown in FIG. 4 which shows a portion out of the deflectable element comprising one spacer 54 just as this was the case with FIG. 3. In order to ensure correct working, the delamination process at the interfaces 104 should be avoided. In other words, it is useful to avoid a delamination of spacer 54 from layers 18 and 20, respectively. FIG. 4 illustrates one possibility to counteract delamination: as just outlined, FIG. 4 illustrates the principal stress at the junctions 104. Assuming that it is possible to calculate the principal stress in spacer 54, the embodiment of FIG. 4 suggests arranging the interface 110 between the material of layers 18 and 20 on the one hand, and an insulating material 112 of spacer 54, on the other hand, so that the interface 110 tends to be parallel to the tensile stress and perpendicular to the compressive stress. In particular, in order to achieve that the contact surface between the insulating material 112 of spacers 54 one the one hand and the material of layers 18 and 20 on the other hand is shaped along the first tensile stress, it should be noted that the first tensile stress may be different from the first principal stress of the structure in the case that the principal stress is associated to compressive stress. An example is shown in FIG. 4. Here, the interface 110 tends to be parallel to the arrows drawn with continuous lines, which shall show the tensile stress, and perpendicular to the arrows drawn with dotted lines which shall indicate the compressive stress induced in spacer 54 in case of applying the attractive force between layers 18 and 20.

Figure 5:
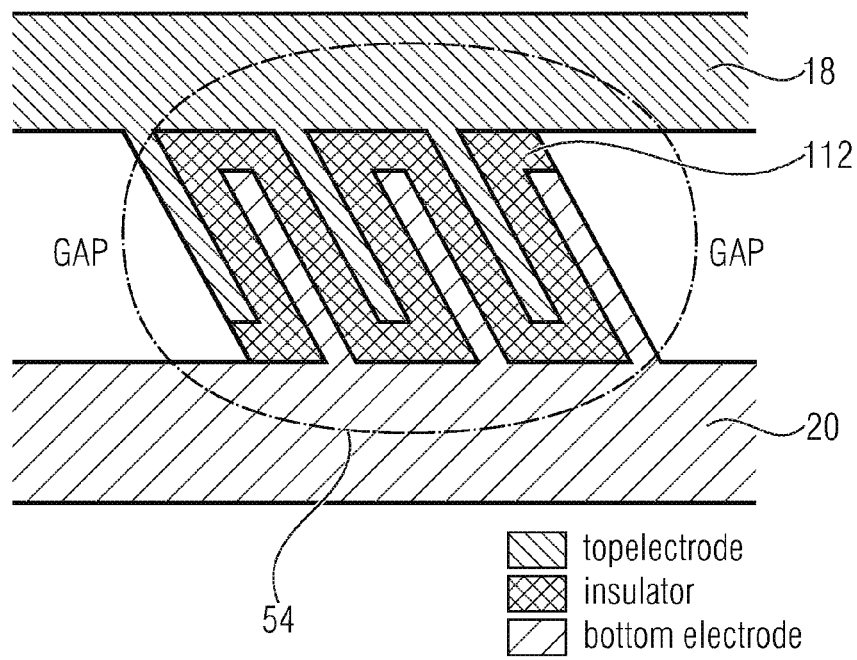
FIG. 5 shows a side view of a spacer in accordance with an embodiment where the danger of delamination is reduced in a manner different compared to FIG. 4.

Another way of avoiding delamination is shown in FIG. 5. Here, the conductive material of the distal and proximal layers 18 and 20, respectively, is interdigitated with the insulating material 112 of spacer 54. In particular, material of layers 18 and 20 protrude into spacer 54 with the insulating material 112 keeping the materials of layers 18 and 20 separated from each other so as to maintain the electrical insulation between layers 18 and 20 via spacer 54.

Figure 6:
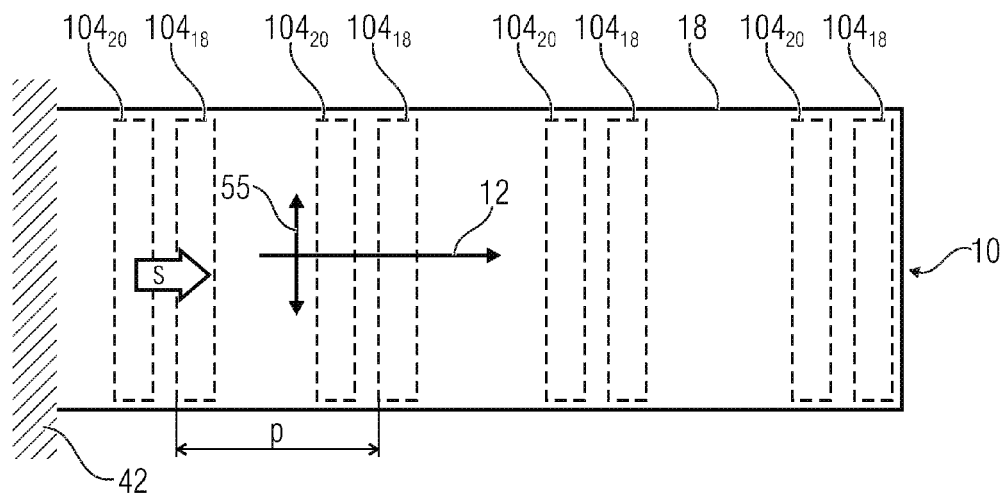
FIG. 6 shows a plan view onto the micromechanical device of FIG. 2 in accordance with an embodiment where the spacers are formed as longitudinal parallelepipeds longitudinally extending in a transverse direction relative to the inclination direction.

Up to now, the embodiments concerning the first aspect of the present application were described with respect to FIGS. 2 to 5 in terms of side elevation views only, i.e., views in which the lateral direction 12 and the spacers 54 are tilted from an upright position in which the spacers 54 would extend along the layer stack direction 30, as in the case as shown in FIGS. 1a to 1g, the vertical axis corresponding to the layer stack direction. In this regard, FIG. 3 was used to explain the physical effect of turning the attractive force between layers 18 and 20 into a deflection of the deflectable element 10 while FIGS. 4 and 5 depicted solutions as to how to decrease the likelihood of delamination of the spacers 54 from the first and second layers, respectively. FIG. 6 provides a plan view onto a micromechanical device in accordance with an embodiment of the first aspect where the spacers 54 are continuously formed along a lateral axis 55 transverse to the tilt direction 12. The footprints or base areas 104 at which the spacers 54 are based on layers 18 and layer 20, respectively, are provided with subscripts 18 and 20 so as to distinguish the portions $104_{18}$ at which the spacers are based on layer 18 and portions $104_{20}$ at which the spacers are based on layer's 20 surface 21. As is shown in FIG. 6, for each spacer, the area $104_{18}$ is displaced from base area $104_{20}$ by a lateral distance s into the lateral direction 12. In FIG. 6, the spacers 54 are arranged at a lateral pitch p along the lateral direction 12. The lateral pitch at which spacers 54 are arranged along the lateral direction 12 may vary along direction 12, and in that case pitch p may denote a mean pitch distance.

Figure 7:
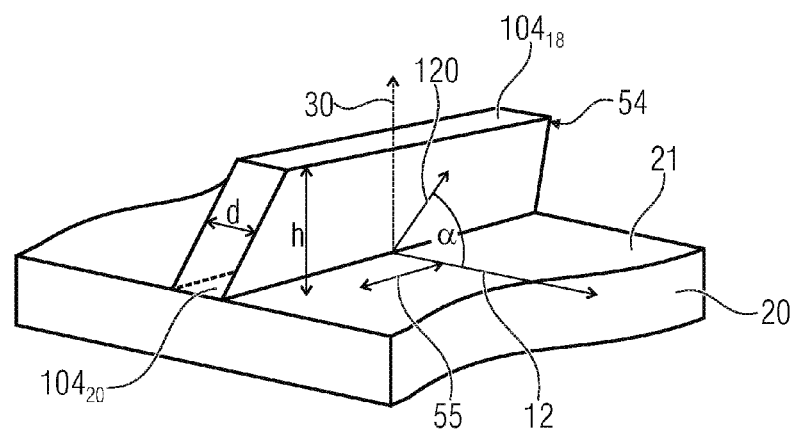
FIG. 7 shows a partial 3-dimensional view of a spacer protruding, in an inclined manner, from one layer, with the spacer corresponding to those of FIG. 6.

FIG. 7 illustrates the resulting shape of spacers 54 illustratively for one spacer, namely a parallelepiped longitudinally extending along the deflectable element's 10 width measured in direction 55 and tilted towards the lateral direction 12 which points along the longitudinal axis of the deflectable element 10 in the example of FIG. 6. In the manner outlined above with respect to FIG. 3, the inclination a of spacers 54 will lead to a deflection of the deflectable element 10 along the layer stack direction 30 so that the layer at which the spacer base areas 104 are displaced downstream along the lateral direction 12, namely layer 18 in case of FIG. 6, forms the outer layer which is less curved or less deflected relative to the other layer, i.e., layer 20 in the case of FIGS. 6 and 7.

Figure 8:
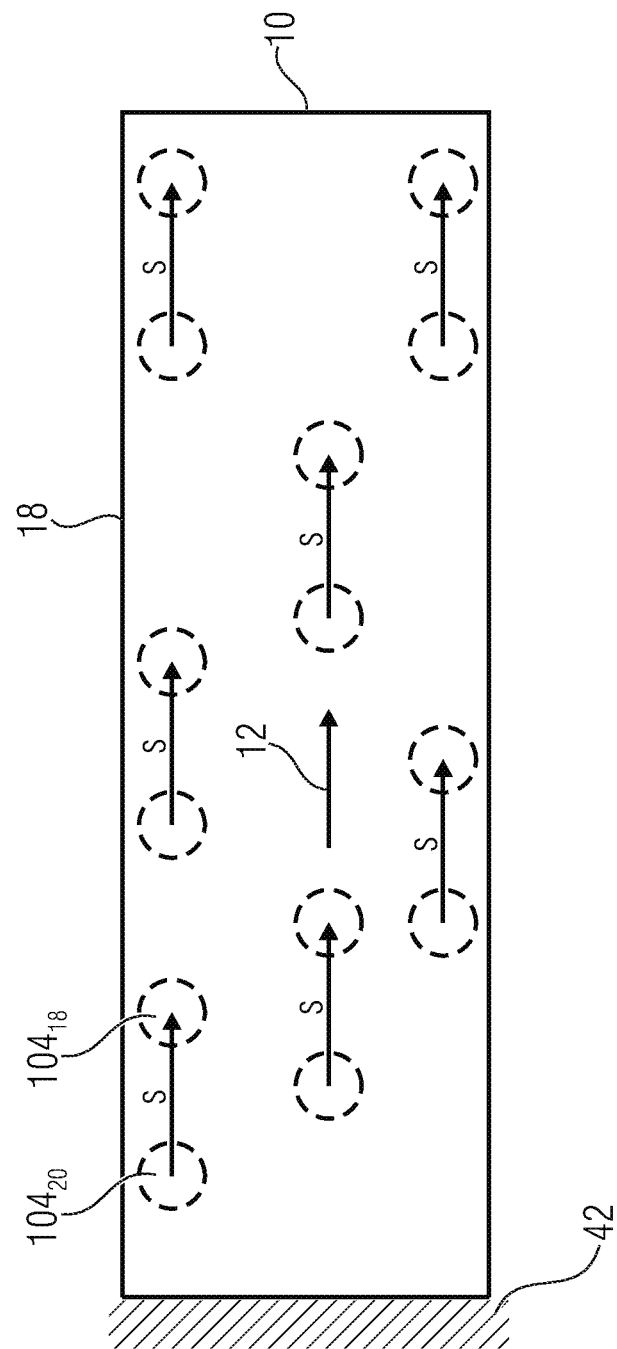
FIG. 8 shows a plan view of a micromechanical device modified relative to FIG. 6 in that cylindrically shaped spacers are used.
Figure 9:
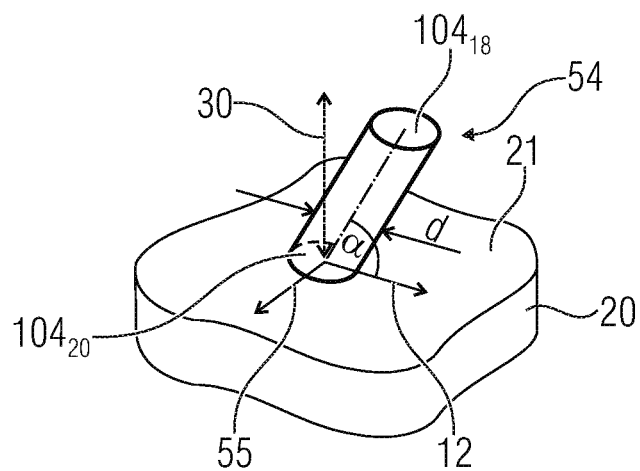
FIG. 9 shows a partial 3-dimensional view of a spacer as used in FIG. 8.

FIGS. 8 and 9 illustrate that the spacers 54 do not necessarily need to be parallelepiped shaped, same may be distributed 2-dimensionally between layers 18 and 20. In the case of FIGS. 8 and 9 for example, the spacers 54 are of cylindrical shape. However, the spacers 54 may also have other shapes.

Figure 10:
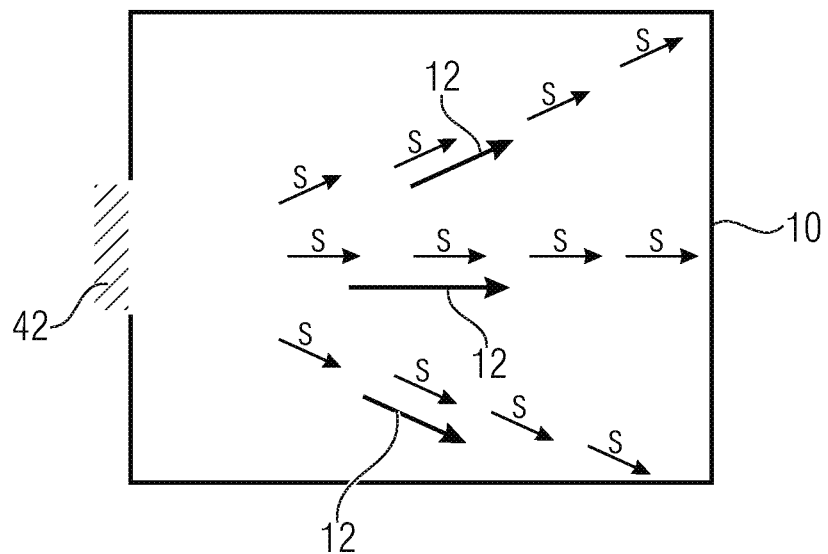
FIG. 10 shows a plan view of a micromechanical device using the concept of FIGS. 2 to 9, illustrating that the inclination direction of the spacers may vary laterally, e.g., may form a divergent field, for example.

Further, FIG. 10 illustrates that the lateral inclination direction may also slightly microscopically vary laterally over the deflectable element 10 so as to result, for example, in 2-dimensional bendings of the deflectable element 10, which may in that case be formed like a membrane.

In accordance with advantageous embodiments, the lateral width d of the spacers 54, measured in direction 12, or the mean thereof in the case of the width varying along the layer stack direction 30, may be chosen such that same relates to the distance h between layers 18 and 20, i.e., the thickness of gap 32, according to $0.001 \cdot h < d < 1000 \cdot h$, according to $0.01 \cdot h < d < 10 \cdot h$, or according to $0.1 \cdot h < d < 0.5 \cdot h$. That is, the spacers 54 may, as far as direction 12 is concerned, be provided with enough width d so as to show enough stiffness so as to perform the deformation of the deformable element 10, but not too much width in order to allow for the deformation of the spacer 54 along its protrusion direction 120 generally pointing from one base area $104_{20}$ to the other base area $104_{18}$ laterally shifted relative to the former one along direction 12. Additionally or alternatively, the mean thickness of layers 18 and 20 may, for instance, be selected so as to be greater than 0.1·h and smaller than 5·h. The deflection angle α relates to displacement s and gap thickness h according to $\tan(\alpha)=h/s$ and may be selected so as to be between 85° and 30°, both inclusively measured against the lateral direction 12.

The just-mentioned intervals are partially difficult to achieve using semiconductor fabrication processes so that compromises may have to be made. Advantageously, the behavior of the spacers is dual, or differently speaking, the behavior is not restricted to the afore-mentioned one. On the one hand, a simple force transfer due to the spacers' geometry takes place and on the other hand, a shear behavior may be seen. The shear behavior is mainly present when the spacer is more high than large, i.e., the width is higher than the thickness of the gap. To be exact, the shear behavior mainly applies when the abscissa of the right corner of the lowest part of the spacer is higher than the abscissa of the left corner of the top part of the spacer. In that case, the deformation is similar to the one drawn in FIG. 3. The second behavior is not as efficient as the first one but can be processed. Anyway, the more the spacer will have a shape that is close to the "shear" spacer, the better the bending of the structure will be. This is possible when the spacer's width and the inclination angle are small. Considering the thickness of the top and bottom electrode, if the thickness is too low, the electrodes will bend locally without transferring their forces to the spacer; and if they are too thick, they will not bend under the pressure gradient generated by the spacer.

The following description relates to embodiments associated with a second aspect of the present application. According to this aspect, the deflection principle outlined above with respect to FIGS. 1a to 1g is adhered to. That is, the attractive force between layers 18 and 20 is used so as to generate lateral stress in these layers, thereby leading, owing to the offset from the neutral axis to a deflection of the deflectable element 10. According to the embodiments of the second aspect outlined further below, however, the effectiveness of the exploitation of this principle is increased by advantageously forming the gap between distal and proximal layers. In particular, in accordance with the embodiments described further below, in each segment a surface of the distal layer, facing the proximal layer via a gap between the proximal and distal layers, bulges out towards or away from the neutral axis, wherein a ratio of half a length of the respective segment in the lateral direction to a difference between a maximum distance of said surface from the neutral axis and a minimum distance of said surface from the neutral axis lies between sin(1°) and sin(10°), both inclusively.

Figure 11:
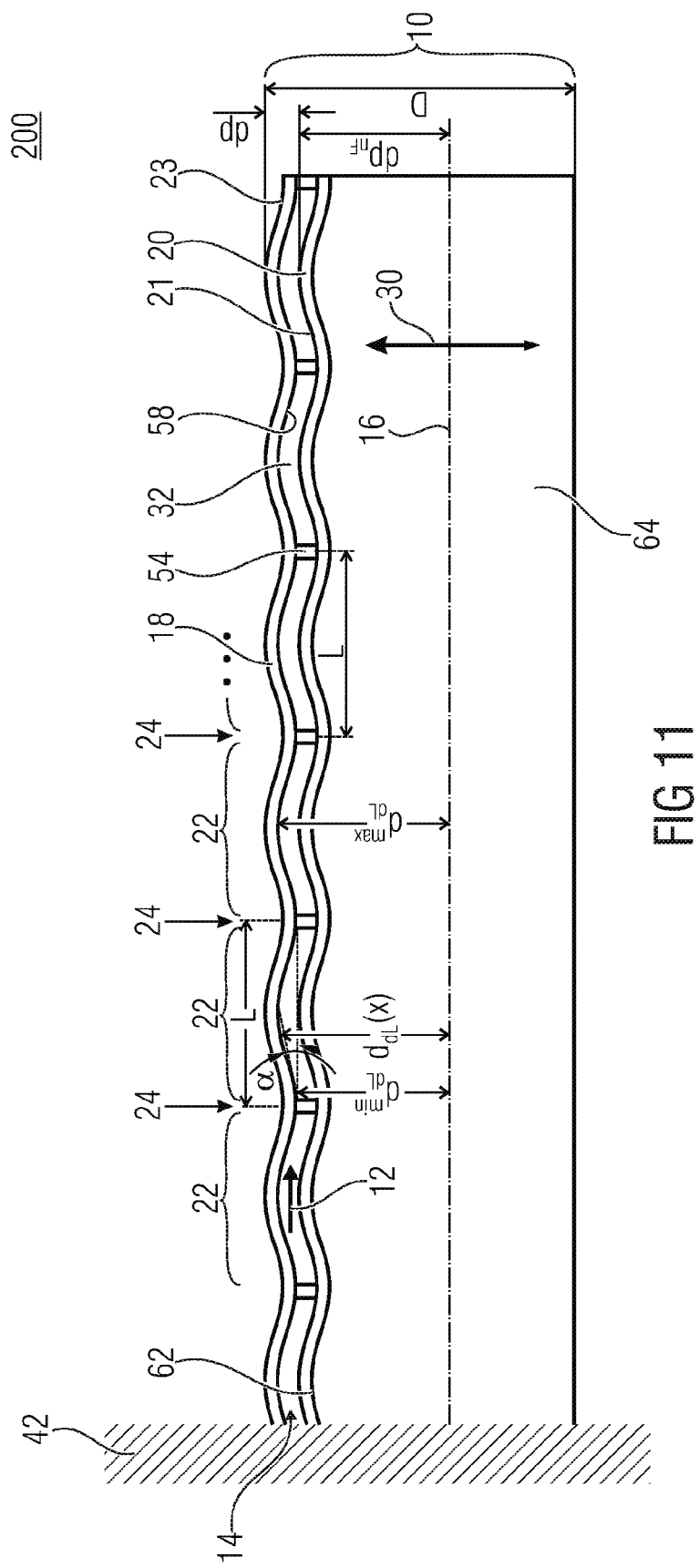
FIG. 11 shows a side view of a micromechanical device in accordance with an embodiment of a second aspect of the present application according to which the surface of the distal layer facing the proximal layer is, per segment, shaped so as to bulge out towards or away from the neutral axis, namely away in the example of FIG. 11.

In order to illustrate this, reference is made to FIG. 11, which shows an embodiment of a micromechanical device 200 varied relative to the micromechanical device of FIG. 1a so as to result in an embodiment according to the second aspect of the present application. As can be seen, the surface 58 of the distal layer 18 is non-planar, thereby differing from the structure shown in FIGS. 1a to 1g. In particular, in each segment 22, the surface 58 bulges out away from the neutral axis 16. The opposite would naturally also be feasible, i.e., in each segment 22, surface 58 could bulge out towards the neutral axis 16. FIG. 11 illustrates this bulging out in a rounded manner similar to a sine function, but the embodiments according to the second aspect described further below will reveal that a bulging in an angled or stepped manner is also feasible and may even be advantageous in terms of alleviating the fabrication process in certain circumstances.

As can be seen in FIG. 11, owing to the bulging out of surface 58 in each segment the distance $d_{dL}$ of surface 58 to neutral axis 16 varies along lateral direction 12, i.e., is a function of x in case of the x axis co-aligning with direction 12. Due to the bulging out of surface 58 in each segment 22, $d_{dL}$ assumes a minimum and a maximum within each segment denoted $d_{dL}^{min}$ and $d_{dL}^{max}$ in the following. In the exemplary case of FIG. 11, where surface 58 bulges out in each segment 22 away from neutral axis 16, the maximum distance $d_{dL}^{max}$ is assumed in the middle of the respective segment 22, such as in the center thereof measured in direction 12, and the minimum distance $d_{dL}^{min}$ may be assumed at both segment boundaries 24 at both ends of segment 22 along direction 12. For example, in each segment, surface 58 might be shaped in a symmetric manner with respect to a plane perpendicular to direction 12 and arranged at the center of segment 22 along direction 12. However, deviations therefrom are feasible.

The significance of the aforementioned ratio is the following: let L be the length of the respective segment 22 along direction 12. In case of $d_{dL}^{max}$ being assumed in the segment's middle along direction 12, $(d_{dL}^{max}-d_{dL}^{min})/(L/2) = \sin(\alpha)$ with a being the mean slope at which surface 58 changes its distance $d_{dL}$ from the center towards the segment boundaries 24. Accordingly, the inventors of the present invention found out that slopes a between 1° and 10°, both inclusively, result in increased effectiveness in terms of deflection amount of the deflectable element 10 at a predetermined attractive force between layers 18 and 20, respectively.

It should be noted that FIG. 11, beyond the above mentioned specifics, also shows the possibility that surfaces 21 and 58 may form substantially conforming to each other, i.e., they may form conformal layers so that in each segment 22 the gap 32 has substantially uniform thickness along direction 12. Layers 18 and 20 may also have uniform or constant thickness, i.e., they may have been formed by conformal deposition. In order to achieve the just outlined slope angle α in the bulging out of surface 58, the main member's main surface 62 may have been structured, or provided with a respective topology which, by way of the conformal deposition, translates into the desired surface shape of surface 58.

Moreover, the description brought forward so far with respective to FIG. 11 neglected the fact that a small portion of surface 58 actually does not abut the gaps 32, but abuts a distally facing end of any of spacers 54 or forms even the outer surfaces of spacers 54 as far as abutting gap 32 and facing the proximal layer 20, respectively. The latter small portions shall be neglected in determining $d_{dL}^{min}$ and $d_{dL}^{max}$.

Figure 12:
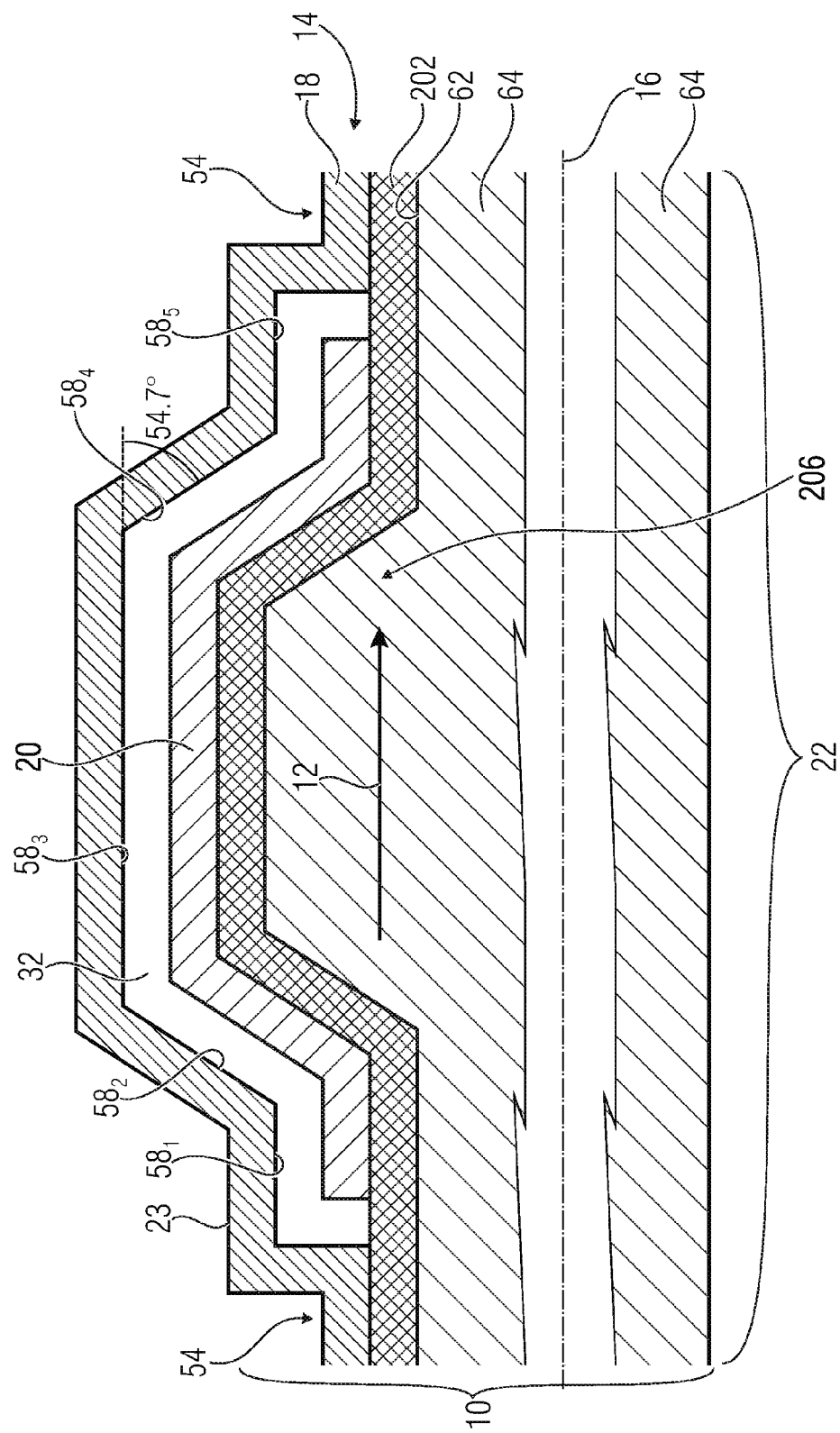
FIG. 12 shows a side view of a fragment of a micromechanical device, namely a segment of a micromechanical device, modified compared to FIG. 11 in that the bulging out corresponds to a bump plateau structure rather than a dome structure.

As described above with respect to FIG. 11, surface 58 was shown as bulging out per segment 22 in a rounded manner. Such a round form is naturally complicated to fabricate. Accordingly, in accordance with embodiments described further below, the achievement of slope angle α is combined with a bulging out of surface 58 per segment 22 in a stepped manner or is combined, speaking differently, with a "plateau" structure of segments 22. FIG. 12 illustrates how a segment 22 of the laminar actuator would look in order to be fabricated more easily. In particular, FIG. 12 shows the micromechanical device as being of the type shown in FIG. 1g; however, with an isolating layer 202 separating the main body 64 of the deflectable element 10 from the footprints of the spacers 54, here being embodied as a bulging out of the distal layer 18 towards the neutral axis 16. Layers 20 and 18, the gap 32 formed therebetween and the insulating layer 202 are formed conforming to each other and conforming to the support surface 62 of the main body 64, which faces layers 18 and 20 and on which the layer stack of 18, 20 and 202 is formed. As shown in FIG. 12, surface 58, i.e., the surface of distal layer 18 facing proximal layer 20 via gap 32 bulges out away from neutral axis 16, thus substantially corresponding to the situation of FIG. 11. However, the surface is formed according to the plateau structure or in a stepped manner. In particular, surface 58 exclusively comprises, and following each other along direction 12 in the order of their mentioning, a plane portion 581, a ramp portion 582, a plane portion 583, a ramp portion 584 and a plane portion 585. The plane portions are parallel to the neutral axis 16, but are distanced differently from the neutral axis 16, and the ramp portions 582 and 584 perform the transition from one plane portion to the next in lateral direction 12 and are accordingly inclined relative to the neutral axis 16. In this regard, it is recalled that in a manner illustrated with respect to FIG. 1b, the arrangement of segment 22 may be such that it is translatorily invariant along a lateral direction transverse to lateral direction 12, i.e., in width direction in case of the deflectable element 10 being formed as a cantilever, for example. In that case, in each segment, the layer stack of layers 18 and 20 seems to form a bump topology bulging out away from the neutral axis 16 and extending longitudinally along a lateral direction transverse to lateral direction 12.

To be more precise, in FIG. 12, all portions 581 to 585 of the proximally facing surface of distal layer 18 are planes, and by carefully selecting the angle of the ramp portions 582 and 584 it is possible to exploit a crystalline structure of the material of the main body 64 to which, as already outlined above, surface 58 is conformal. For example, this is done by conformally depositing the layer stack onto the main body's 64 main surface 62, which has been provided with the desired topology appropriately, namely with a bump 206 bulging out away from the neutral axis 16 having a plane plateau surface extending parallel to neutral axis 16 at its middle relative to lateral direction 12, flanked by two plane slope portions at both sides along lateral direction 12 and surrounded, beyond the plane slope portions along direction 12, by plateau portions of surface 62 which are again parallel to neutral axis 16.

Figure 13:
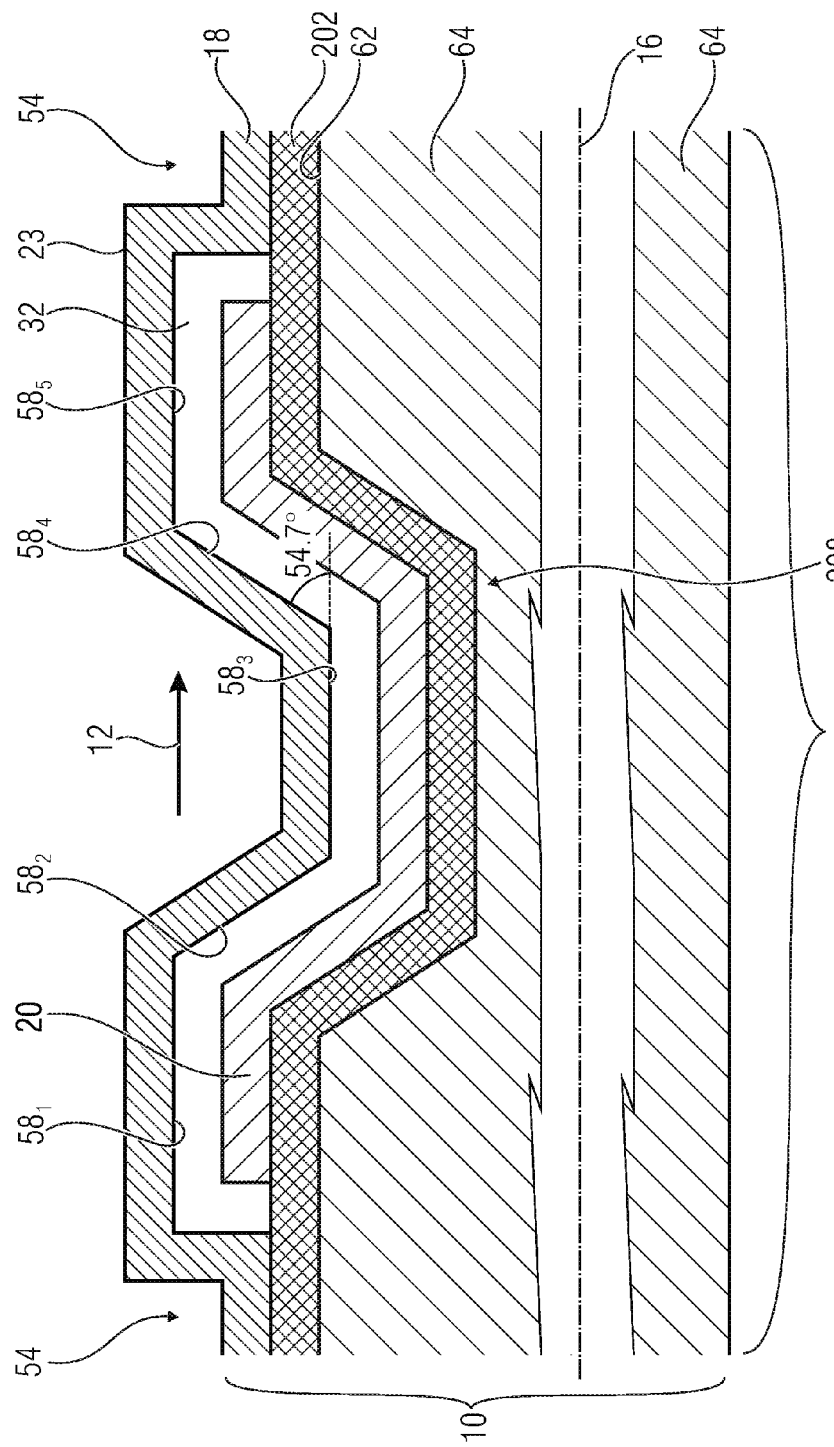
FIG. 13 shows a side view of a segment of a micromechanical device modified compared to FIG. 12 in that the plateau structure bulges out towards the neutral axis, thereby resulting in a groove plateau structure.

FIG. 13 illustrates for the sake of completeness that the plateau structure of FIG. 12 may likewise be transferred onto a bulging out of surface 58 per segment 22 towards the neutral axis 16. By this the distance of the middle plane portion 583 to the neutral axis 16 is smaller than the distance of the outer plane portions 581 and 585 to the neutral axis 16, contrary to the case shown in FIG. 12. Accordingly, the surface 62 of the main body 64, from which surface 58 inherits its step-wise shape, is formed so as to comprise a groove 208 per segment 22, the groove having, along direction 12, a plateau which is parallel to neutral axis 16, flanked by slope plane portions at both sides along direction 12, and even further surrounded beyond the slope plane portions by a plateau being also parallel to neutral axis 16, but at a farther distance therefrom, the groove 208 longitudinally extending laterally in a direction transverse to the lateral direction 12.

It is important to mention that the predominate behavior of the bump plateau segment structure of FIG. 12 is that the resulting deflectable element 10 composed of these segments is urged to curve or bend along axis 30 away from the distal layer 18, i.e., downward in the case FIG. 13, while the effect of designing segment 22 in accordance with the groove plateau structure depicted in FIG. 13 results in the deflectable element 10 bending the other way around, i.e., upwards in the case of FIG. 13.

It should be noted that although FIGS. 12 and 13 show segments 22 to be formed symmetrically with respect to a plane perpendicular to lateral direction 12, namely to a plane running through the center of segment 22 along direction 12, this is merely an example and deviations therefore are feasible.

The structures for segments 22 shown in FIGS. 12 and 13 may be easily manufactured in the following manner. In particular, in order to provide each segment 22 with the plateau structure of FIG. 12 or the plateau structure of FIG. 13, it is for example possible to choose silicon as the material for the main body 64 and to choose, for example, the plane portions 581, 583, 585 to be parallel to the silicon crystal plane (100) and the ramp portions 582 and 584 to be parallel to the silicon crystal plane (111). By this measure, the angle of the ramp portions 582 and 584 relative to the plane portions or neutral axis 16, respectively, would be 54.7°, wherein, however, it is noted that different possibilities exist to select the material for the main body 64.

Figure 14:
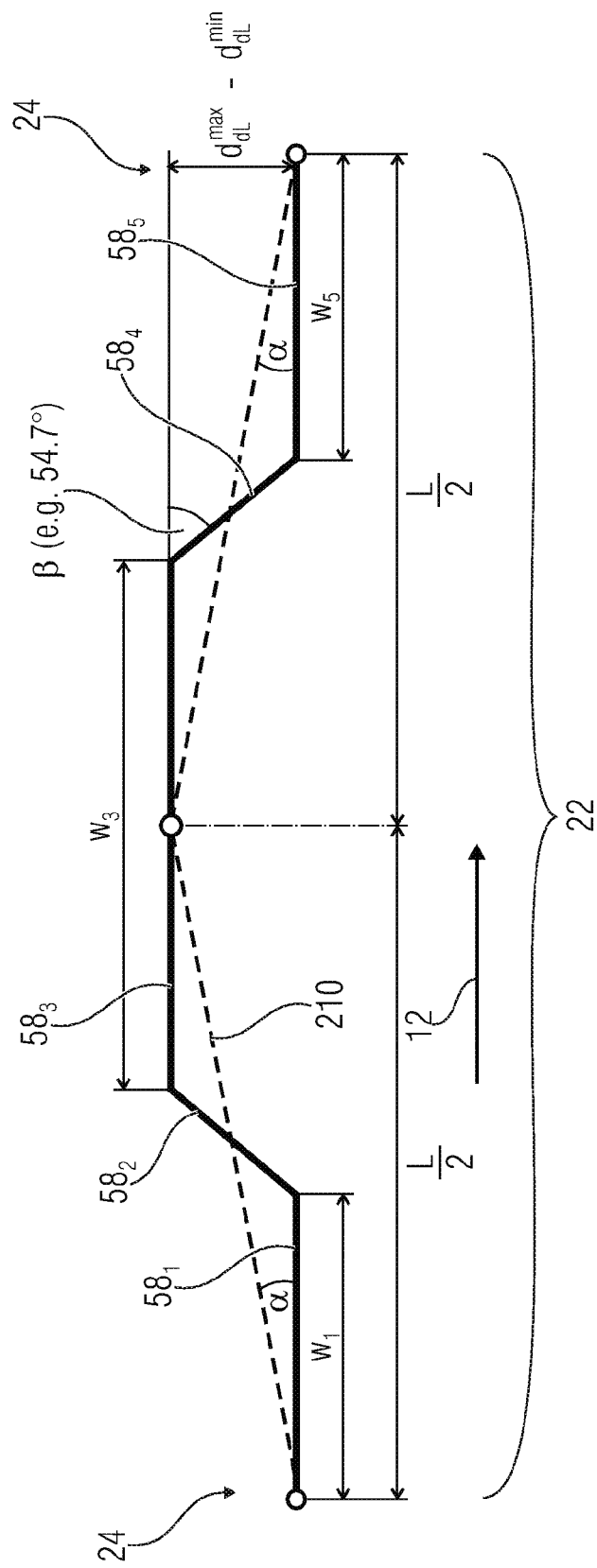
FIG. 14 schematically illustrates how a plateau structure may be designed so as to fulfill the advantageous setting of the slope angle explained with respect to FIG. 11.

Unfortunately, the angle of 54.7° is out of the aforementioned effective slope range of 1° to 10°. However, the inventors of the present application found out that a plateau structure as shown in FIGS. 12 and 13 may be designed such that the effective slope angle corresponds to the effective range. Reference is made to FIG. 14, which shows that, if the widths of plane portions 581, 583 and 585 measured along direction 12, namely w1, w3 and w5, are selected appropriately an effective slope angle α results which lies within the aforementioned range, namely 1° to 10°, both inclusively. That is, $w_1$, $w_3$ and $w_5$, are selected such that $$\tan(\alpha) = \frac{2 \cdot (d_{dL}^{max} - d_{dL}^{min})}{w_1 + w_3 + w_5 + 2 \cdot \frac{d_{dL}^{max} - d_{dL}^{min}}{\tan(\beta)}}$$

with α lying within the aforementioned range, namely 1° to 10°, both inclusively. Please note that the fact that the effective slope angle α 1 to 10°, both inclusively, shall include both slope angle directions on both sides of the respective segment along lateral direction, i.e., a shall be between 1° to 10°, both inclusively, or −10° to −1°, both inclusively, with this being true for the above and below mentioned occasions of the angular range concerning the slope angle. Alternatively, $w_1$ and $w_5$ are selected to be equal and selected along with $w_3$ such that $$\tan(\alpha) = \frac{d_{dL}^{max} - d_{dL}^{min}}{w_1 + \frac{d_{dL}^{max} - d_{dL}^{min}}{\tan(\beta)} + \frac{w_3}{2}}.$$

Figure 15:
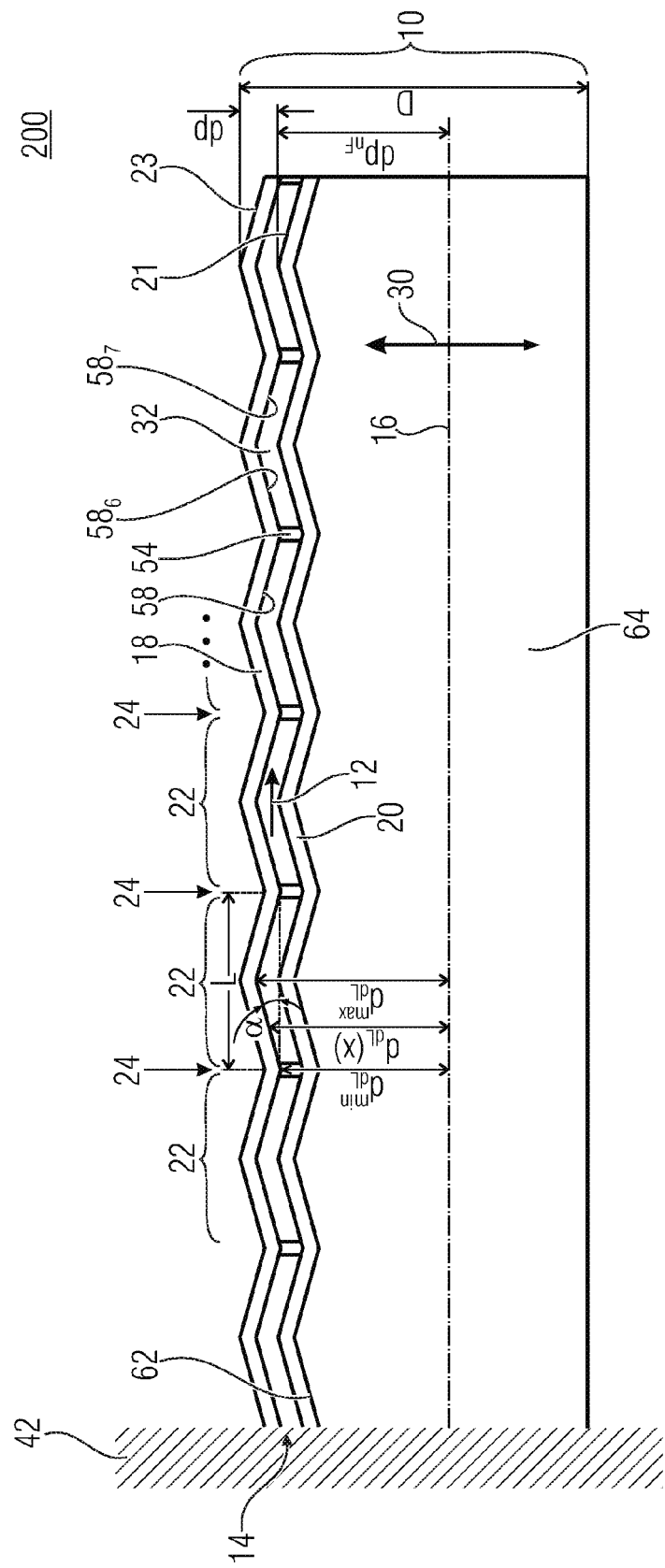
FIG. 15 shows a side view of a micromechanical device differing from FIG. 11 in that the dome structure is replaced by a roof structure.

That is, the center of plateau 583 in the segment's 22 middle along direction 12 should be connected to the extremal distance points of surface 58 at the segment boundaries 24 by a virtual line 210 which is inclined relative to lateral direction 12 or to the neutral axis 16 by an inclination angle α which lies within the advantageous range. If so, the plateau structure participates in the efficiency gains resulting from choosing the slope angle as discussed already above with respect to FIG. 11. For the sake of completeness, FIG. 15 shows an exemplary case where surface 58 bulges out per segment 22 in an angled manner, i.e., in accordance with a V-shape. That is, in the case of FIG. 15, the structure in surface 62 which lends its topology to surface 58 via the conformity position is, for example, a V-shaped groove or a V-shaped roof. In that case, for instance, surface 58 would be composed of, along the lateral direction 12, two ramp portions inclined relative to the neutral axis 16 in the advantageous inclination angle range, namely 1° to 10°, both inclusively.

Even though FIG. 15 exemplarily referred to a bulging out of surface 58 in each segment, as just embodied, this embodiment is easily transferable to the case of bulging out of surface 58 towards the neutral axis.

Thus, summarizing the embodiments of FIGS. 11 to 15, it is advantageous if the slope angle of a bulging out of surface 58 towards or away from the neutral axis per segment lies in a certain range, namely within 1° and 10°, both inclusively, wherein this is true not only for a bulging out in an angular manner, but also true for other shapes, such as shapes of the plateau structure, the fabrication of which is easier. In particular, while the geometry of the micromechanical device shown in FIG. 15, in terms of bending capacity for a defined attractive force between layers 18 and 20, respectively, and for a defined stiffness of the deflectable element, is very efficient, this roof or V-groove structure is not compatible with most semiconductor fabrication processes. In other words, a "roof geometry" in accordance with FIG. 15 with both sides of the roof being flat planes $58_5$ and $58_7$ having a defined angle $\alpha$ with a lateral plane, i.e., the neutral axis 16, which may correspond to the silicon wafer substrate plane, is feasible but extremely difficult to achieve with standard technological processes. In other words, it is easier to obtain certain angles, that is discrete angles, in an easy manner and with enough reproducibility, namely in case of certain crystalline materials. Silicon is just one example which has been mentioned above. The etching of a <100> silicon surface will let a crystalline plane <111> appear along a photomask that has an exact angle of 54.7° with the surface of the substrate of the silicon. This is the angle of the slope of the bump and the groove of the structures presented in FIGS. 12 and 13.

An optimization algorithm, using the Finite Element Method, has been applied to the roof and the plateau geometries shown in FIGS. 12, 13, 14 and 15. For the roof structure shown in FIG. 15, the angle value permitting to achieve the highest deflection of the deflectable element 10 was calculated as being between 1 and 10° and even better between 5° and 10°, which angular interval is far away from the silicon plane angle presented previously, namely 54.7°. The development of the plateau topology shown in FIGS. 12 and 13 (and FIG. 14, respectively) is a solution permitting to bypass that physical constraint. For the optimized plateau geometry, the optimization being depicted in FIG. 14, it has been managed to observe equivalent angles, created by a topology composed, for half of a segment, of a flat surface of width w3/2 followed a slope of 54.7° having a certain height corresponding to $d_{dL}^{max} - d_{dL}^{min}$ and then another flat surface of width $w_{15}$.

It should be noted that several modifications are feasible with respect to the above embodiments. For example, the middle plateau or plane portion $58_3$ could be left off so that the ramp portions directly abut each other. Likewise, merely one plane portion could exist. The angle $\beta$ could be different than stated before in case of using another crystalline material for the main body, and is, for example, greater than 20°.

Figure 16:
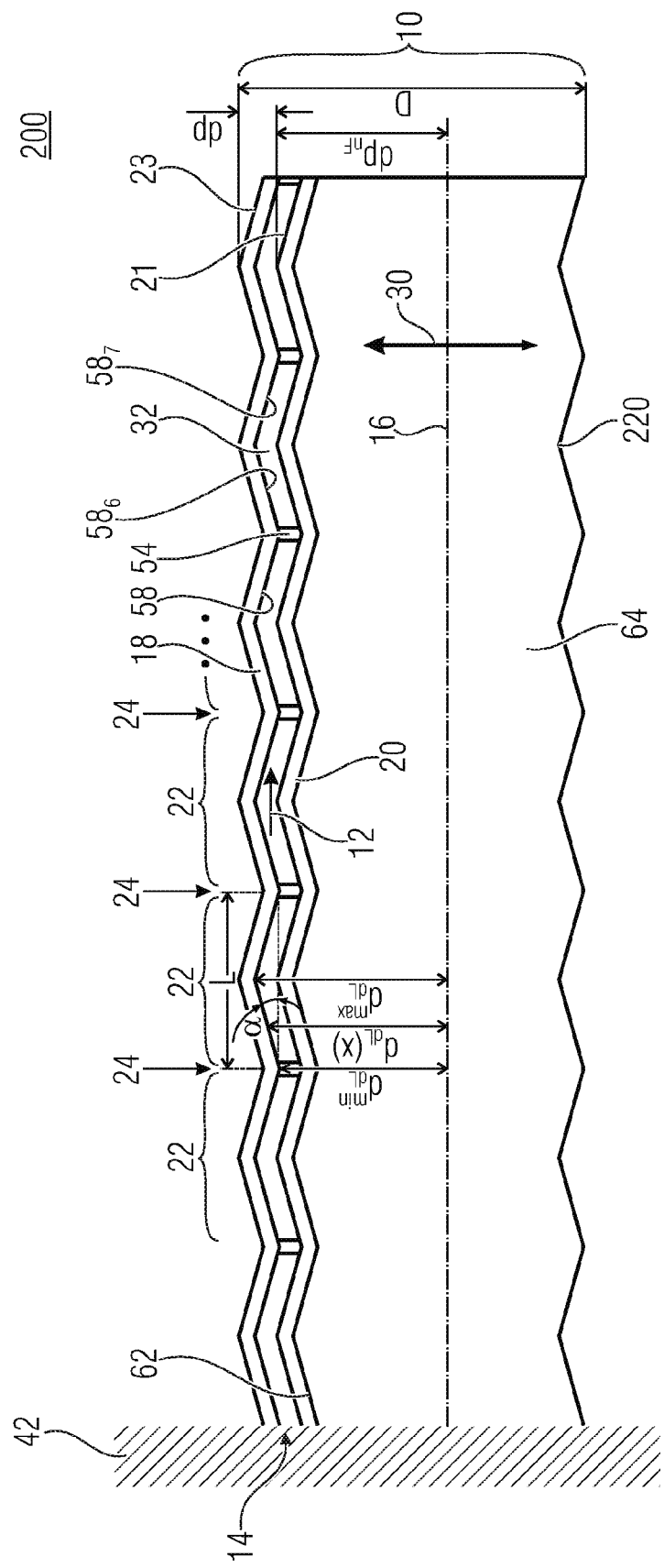
FIG. 16 shows a side view of a micromechanical device in accordance with an embodiment of a third aspect of the present application according to which an oppositely facing surface of the deflectable element is formed in a conforming manner relative to the gap, here exemplarily illustrated as a modification of the micromechanical device of FIG. 15, but also applicable to all other embodiments with a non-planar gap per segment.

In the following, embodiments of a third aspect of the present application are described. In accordance with the third aspect, the effectiveness of the deflection of the deflectable element of FIGS. 1a to 1g is increased by forming both the gap between the proximal and distal layer as well as a surface of the deflectable element facing away from the gap, i.e., the bottom surface in the case of FIGS. 1a to 1g, in a non-planar manner and in a manner conforming to each other. For example, FIG. 16 illustrates a micromechanical device according to which the segments are formed in accordance with a roof structure. The roof structure was presented above with respect to FIG. 15. It should be noted, however, that the effectiveness increase presented now with respect to FIG. 16 is also valid for other slope angles $\alpha$ than those specifically discussed above as being especially advantageous. To be more specific, in the case of FIG. 16 the slope angle $\alpha$ of the roof structure may be different or lie outside the range of 1° to 10°, both inclusively, or within that range.

In any case, as shown in FIG. 16, the surface 220, namely the main surface 220, facing away from main surface 62 of the deflectable element 10 is shaped in a manner conformal to surface 62 and additionally gap 32. That is, where gap 32 bulges out away from neutral axis 16 along direction 12, surface 220 bulges out towards the neutral axis 16, i.e., bulges out in the same direction, and in between these areas surface 220 bulges out the other way around. That is, in case of gap 32 bulging out away from the neutral axis 16 in each segment, indentations are formed in surface 220 in a manner aligned along the lateral direction 12 with the bulgings of gap 32, whereas protrusions or hills are formed between the indentations or valleys along lateral direction 12. It has been found out that providing the deflectable element with this conformal oppositely facing surface 220, namely providing the topology of the oppositely facing surface of the main body 64, increases the efficiency of the deflectable element 10, namely its deflection amount a predetermined attractive force being applied to layers 18 and 20, respectively.

Figure 17:
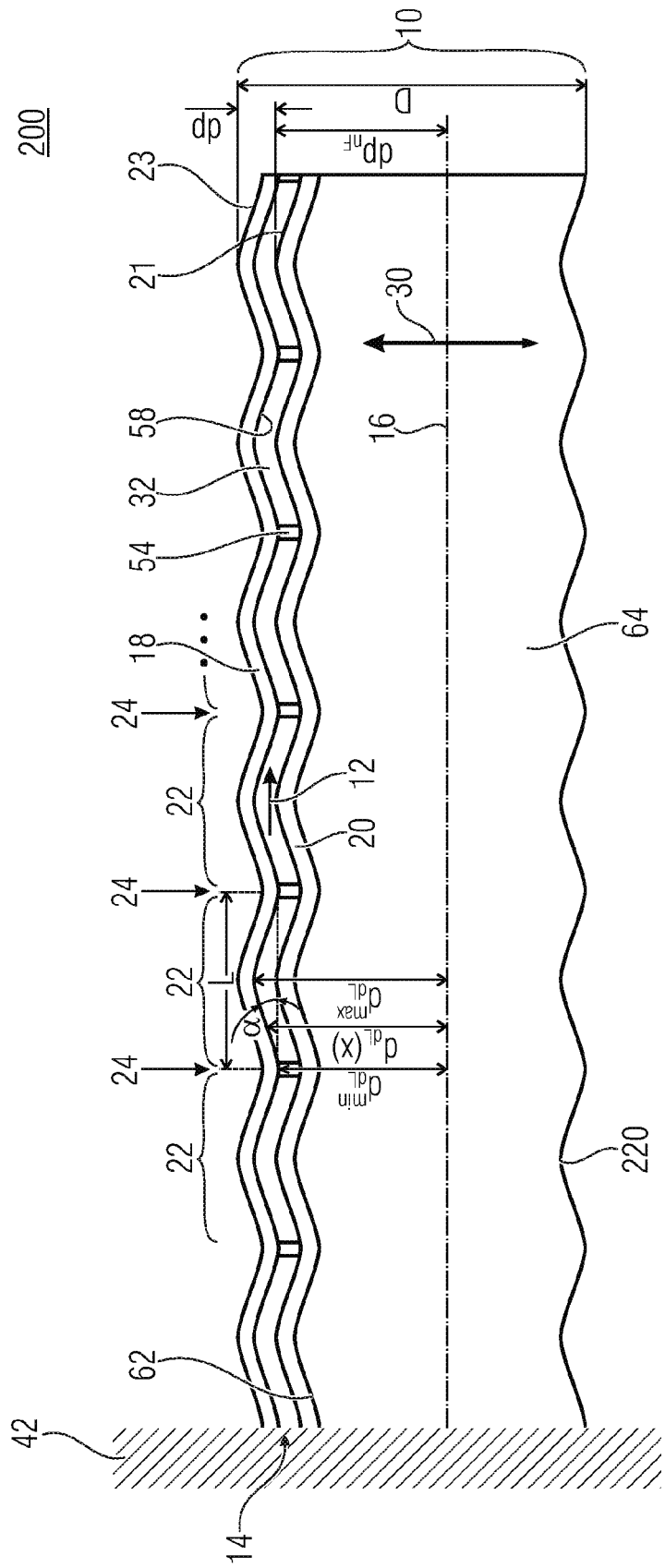
FIG. 17 shows a side view of a micromechanical device modified relative to FIG. 17 by replacing the roof structure by a dome structure.
Figure 18:
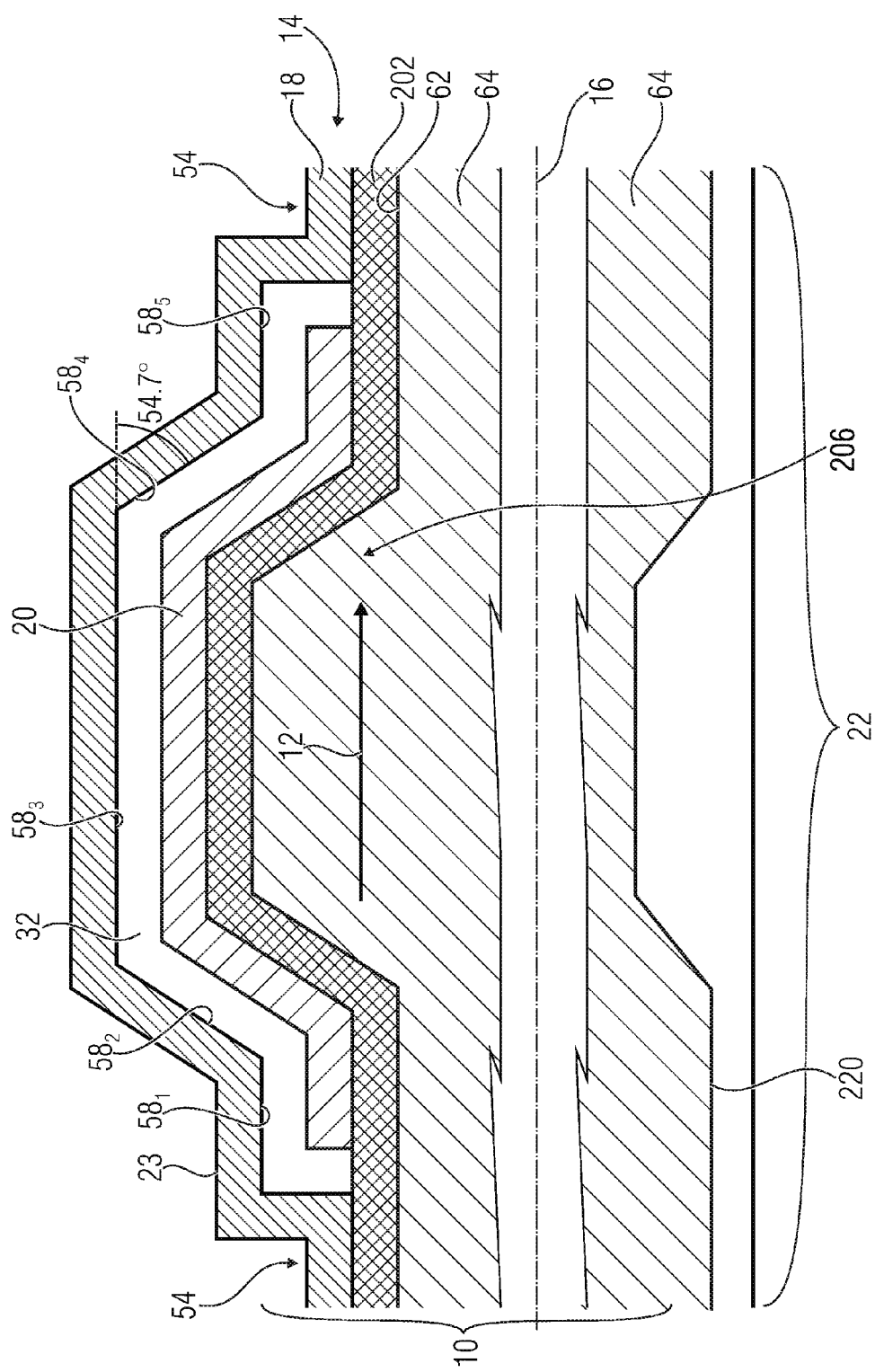
FIG. 18 shows a side view of a micromechanical device modified compared to FIG. 16 by replacing the dome structure by a bump plateau structure.
Figure 19:
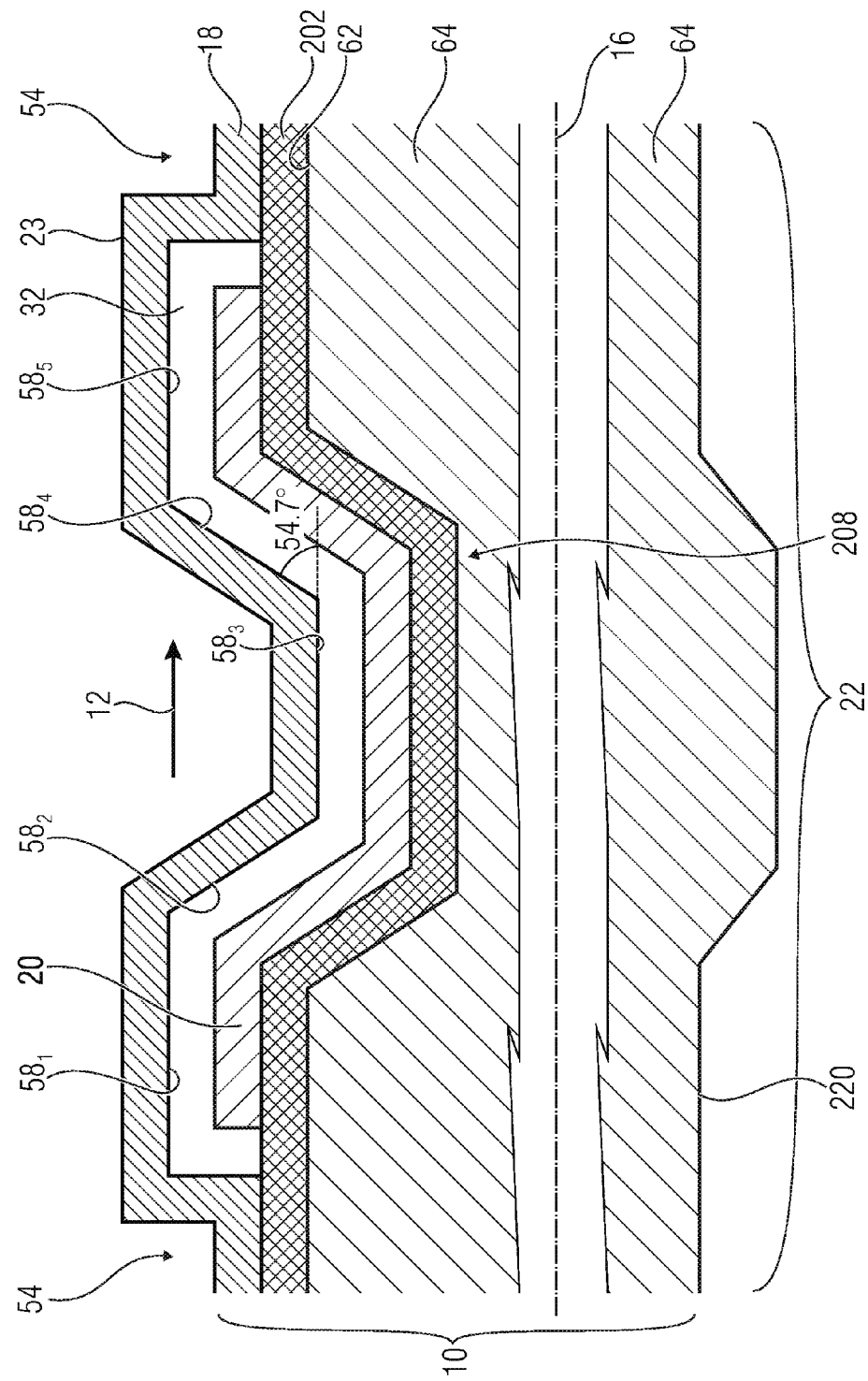
FIG. 19 shows a side view of a micromechanical device modified relative to FIG. 18 in that a groove plateau structure is used instead of a dome structure.

For the sake of completeness, FIGS. 17, 18 and 19 show that the conformal way of shaping the rear surface 220 may also be applied to other segment structures, namely the dome structure of FIG. 11, the bump plateau structure of FIG. 12 and the groove plateau structure of FIG. 13. Other than the conformities mentioned above with respect to layers 18 and 20, for example, the conformity between surface 220 and gap 32 in the case of FIGS. 16 and 19 is not necessarily fulfilled strictly in a mathematical sense. For example, it suffices if the bulging out of gap 32 per segment is aligned with respective indentations and hills such as grooves and protrusions in surface 220 along direction 12, i.e., if valleys are formed in surface 220 along direction 12 registered to a bulging out of gap 32 per segment away from the neutral axis 16, with protrusions being arranged in the surface 220 along direction 12 therebetween, or vice versa.

Figure 20:
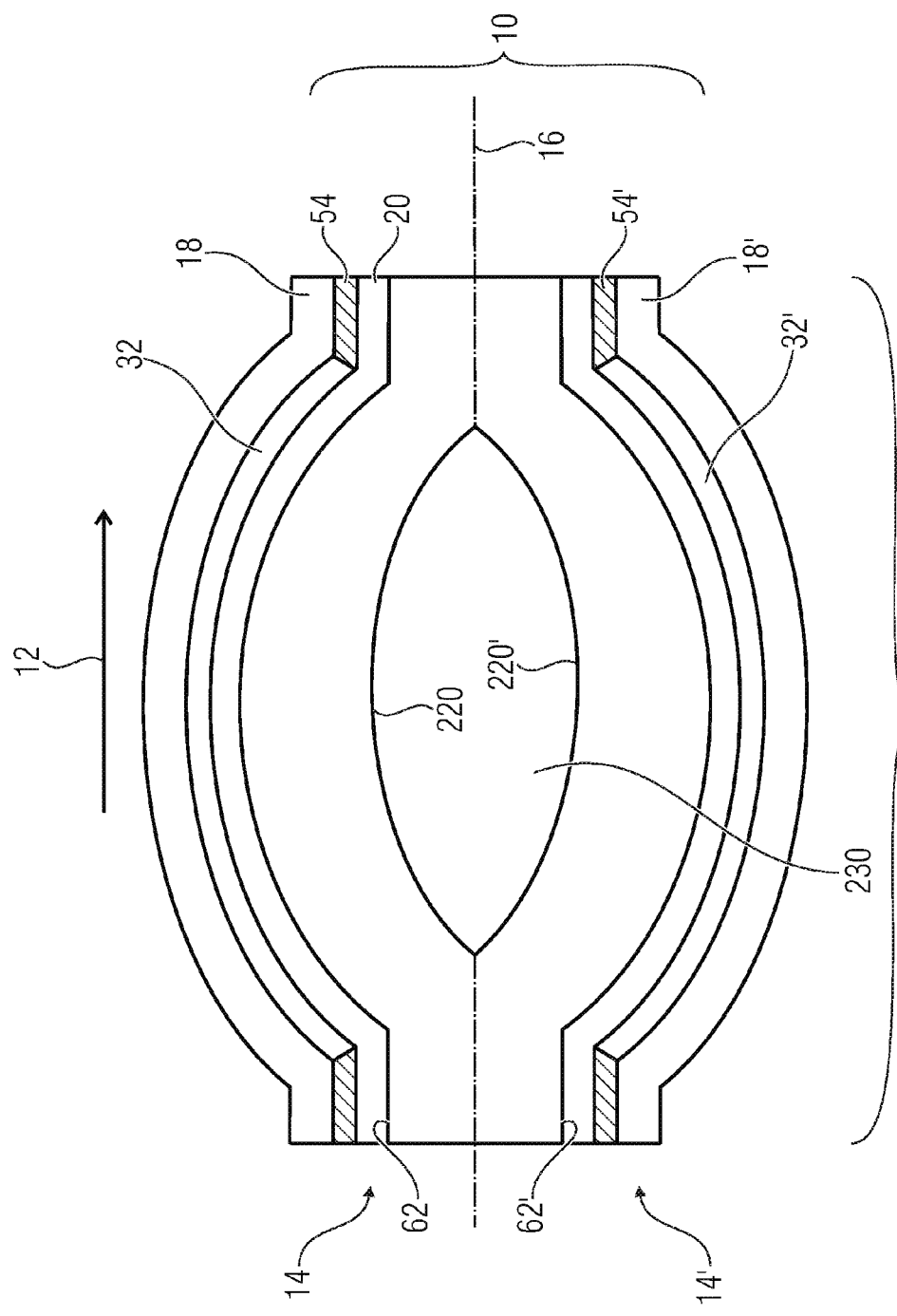
FIG. 20 shows a side view of a segment of a micromechanical device modified compared to the embodiment of FIG. 17 in that two laminar actuators are provided at opposite main surfaces of the main body of the deflectable element.

FIG. 20 shows representatively with respect to the dome structure that the conformally shaped oppositely facing surface 220 of the deflectable element 10 does not necessarily need to be an outer surface of the deflectable element 10 residing on the other side of neutral axis 16 relative to gap 32. Rather, FIG. 20 shows a deflectable element 10 having, in addition to plate capacitor 14 (laminar actuator 14) another laminar actuator 14' arranged on the deflectable element's 10 other side, namely in a manner mirrored in the neutral axis 16 so that both laminar actuators 14 and 14' oppose each other via the neutral axis 16. In each segment 22, the gap 32 and 32' of laminar actuator 14 and 14' bulges out away from the neutral axis 16, i.e., in opposite directions. Accordingly, in the case of FIG. 20, aligned in the lateral direction 12, there is, for each segment a cavity 230 having an inner surface, a first portion of which is shaped conformal to gap 32, namely the side of the surface of cavity 230 nearer to laminar actuator 14 and indicated with reference sign 220 in FIG. 20, and a second portion which is conformal to gap 32', namely the side of the inner surface of cavity 230 which is nearer to laminar actuator 14'. As shown in FIG. 20, the cavity 230 is arranged within the neutral axis 16. Such a cavity 230 exists for each segment 22. By applying the voltage (or the attractive force) between layers 18 and 20, of laminar actuator 14, the deflectable element 10 is deflected into one direction, namely downward in the case of FIG. 20, while the opposite deflection direction is achieved by exerting the attractive force between layers 18' and 20' of laminar actuator 14'. The provision of cavities 230 increases the efficiency of deflection.

Figure 21:
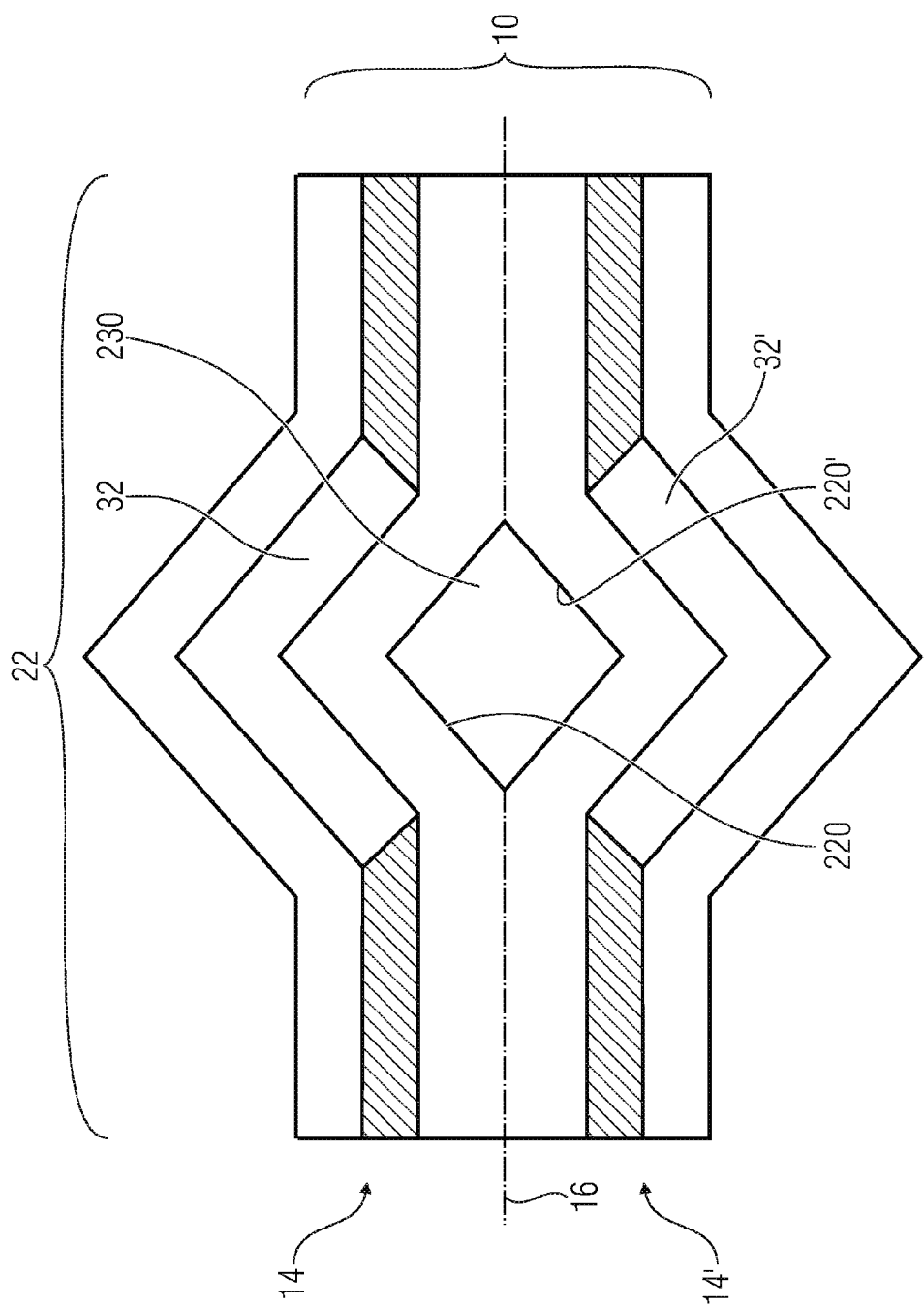
FIG. 21 shows a side view of a segment portion of a micromechanical device in accordance with an embodiment modified relative to FIG. 20 in that the dome structure is replaced by a roof structure.

FIG. 21 merely exemplarily illustrates that the possibility outlined with respect to FIG. 20 is readily transferable onto any other of the above discussed structures, such as any of the plateau structures. FIG. 21 relates to a roof structure. In the case of a bulging out of the gap 32 in each segment towards the neutral axis, such as the groove plateau structure, the cavities 230 would be aligned, along direction 12, to the segment boundaries between segments 22 rather than to the segment's mids along direction 12 as depicted in FIGS. 20 and 21.

In comparing the dome structures explained above with the roof shape structures, for example, it turns out that the dome shape structures have a decreased likelihood of the distal layer 18 collapsing onto the proximal layer 20. In particular, the dome shape of the distal layer 18 provides the distal layer 18 with higher stability compared to the roof structure. As already denoted above, the proximal layer 20 may be shaped in conformity with the distal layer 18, and so the gap 32 may, too. As far as the manufacturing of such roof or dome structures is concerned, a deflectable element 10 of a micromechanical device using such dome or roof structures may, for instance, be fabricated as an in-plane actuator as outlined above with respect to FIG. 1c, for example.

In any case, the embodiments outlined above with respect to FIGS. 16 to 21 revealed that a conformal thickness of the main body 64 with accordingly creating indentations or empty space under the bulging out of the laminar actuators 14 and 14' strongly improves the capacity of bending the deflectable element without decreasing the stiffness of the deflectable element 10 as much. The plane symmetry shown with respect to FIGS. 20 and 21 permits a bilateral bending of the deflectable element.

Figure 22:
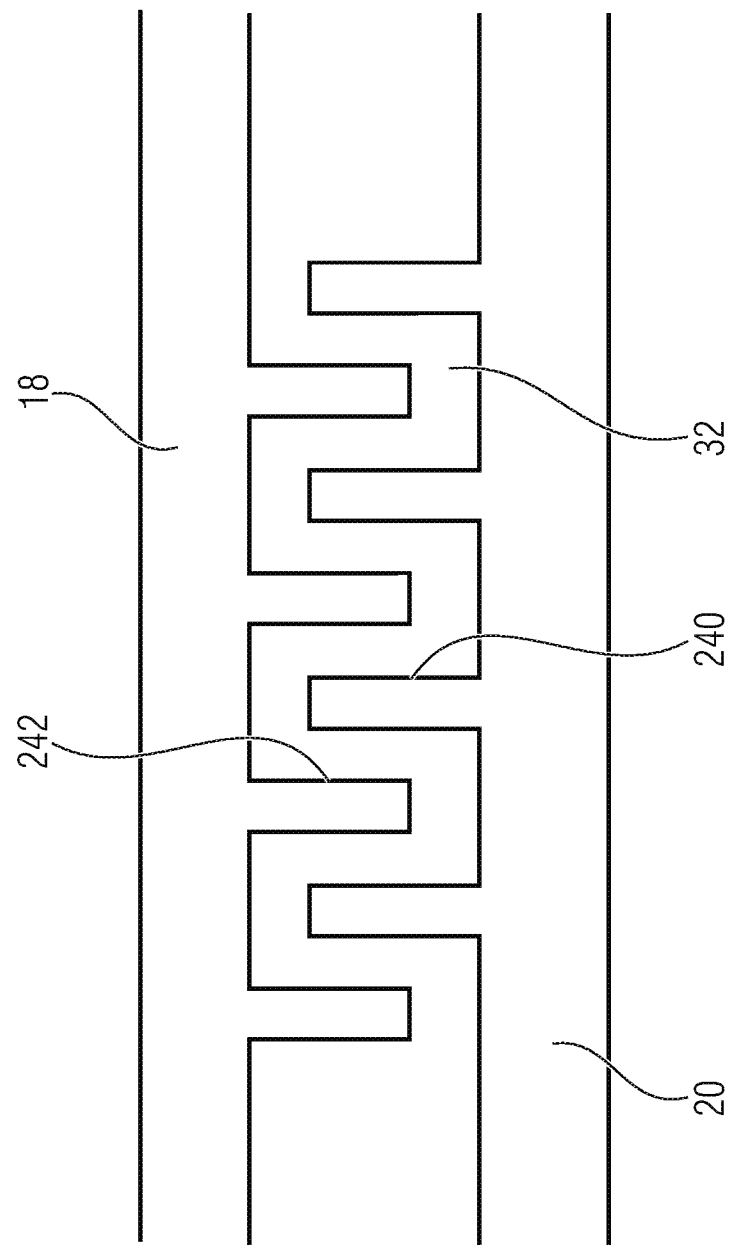
FIG. 22 shows a side view of a fraction out of the layer stack in accordance with any of the above outlined embodiments for illustrating an interdigitated comb electrode structure formed by protrusions of both layers in accordance with an embodiment.

A possibility of increasing the attractive force between layers 18 and 20 in case of layers 18 and 20 forming electrodes of a plate capacitor upon applying a predetermined voltage between both layers 18 and 20 is shown with respect to FIG. 22. FIG. 22 shows that layers 18 and 20 comprise protrusions 240 and 242, respectively, which protrude into gap 32 so as to interdigitally engage with each other. By this measure, the mutual attraction of layers 18 and 20 upon applying a certain voltage between both layers 18 and 20 is increased.

Figure 23:
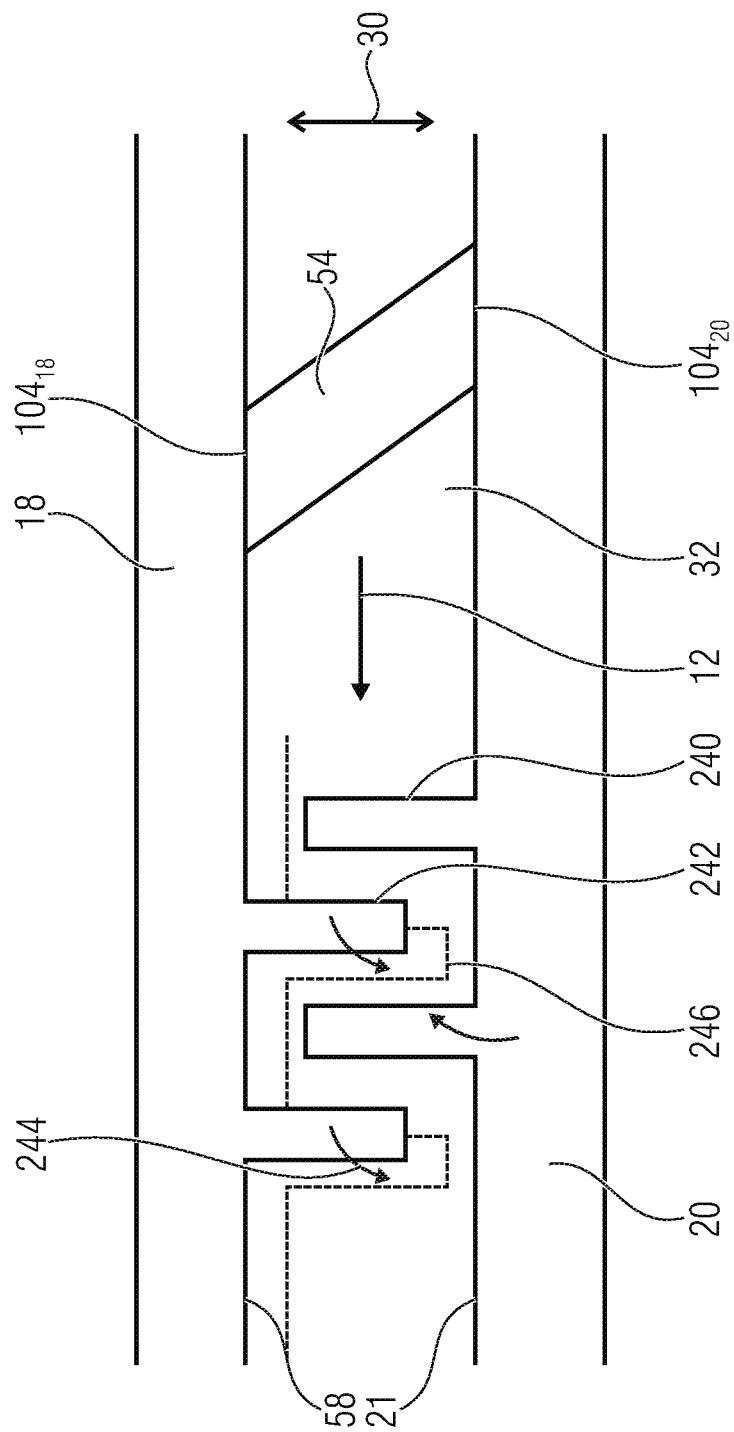
FIG. 23 shows a schematic side view illustrating the danger of colliding protrusions in case of applying the comb structure of FIG. 22 to embodiments of the first aspect of the present application using the inclined spacers.
Figure 24:
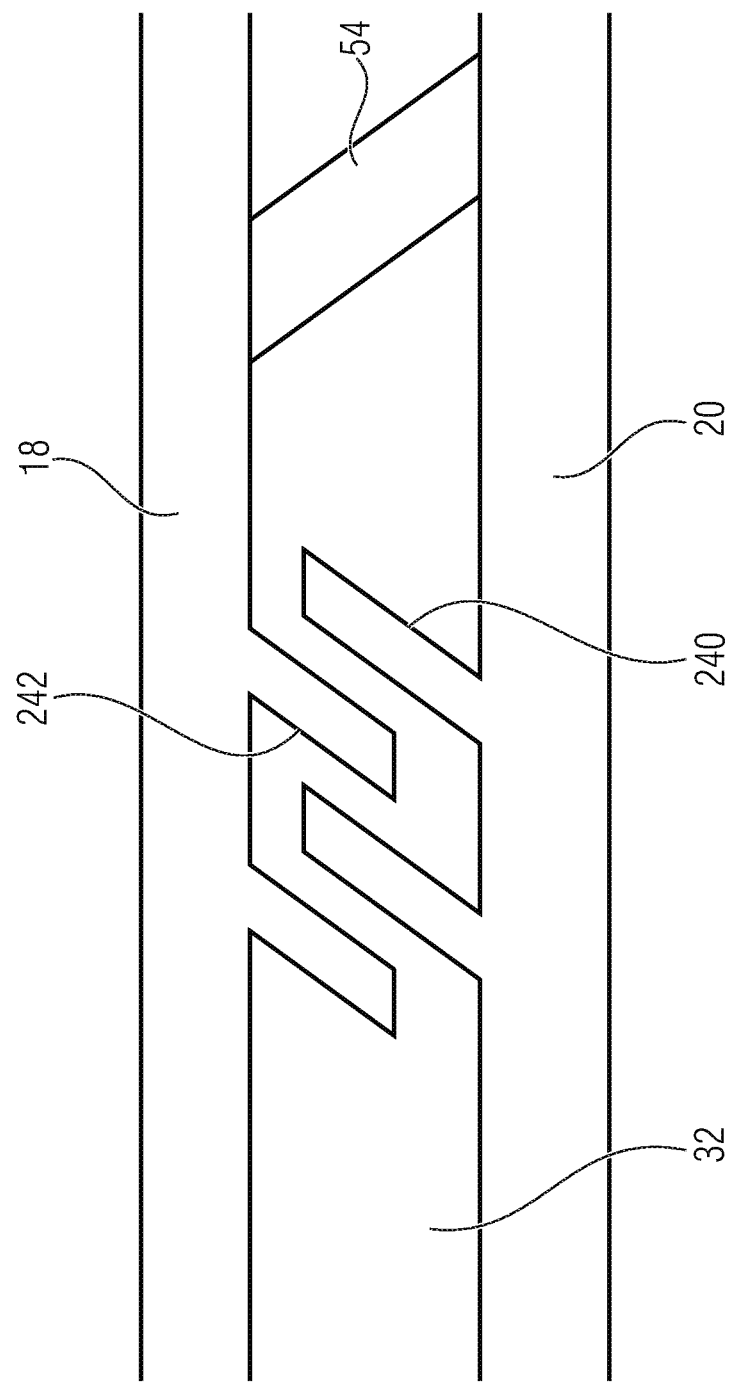
FIG. 24 shows a side view of a comb structure modified relative to FIG. 22 so as to counteract the collision situation explained with respect to FIG. 23.

In applying this concept onto the above-outlined embodiments of the first aspect, the protrusions 220, 240 and 242 could be inclined relative to the layer direction, i.e., inclined so as to not protrude into gap 32 along the layer stack direction, but at some other inclined angle, namely in order to avoid a collision between the protrusions 240 of layer 20 with the protrusions 242 of layer 18 upon activating the actuator, i.e., upon applying the attractive force between layers 18 and 20. In particular, FIG. 23 shows the protrusions 240 and 242 along with one of spacers 54. The spacer 54 is inclined from its upward position along the layer stack direction 30 to towards lateral direction 12. That is, upon applying the attractive force between layers 18 and 20, layers 18 and 20 will experience some movement relative to each other, namely layers 18 and 20 will tend to get closer to each other along the layer stack direction 30 and will tend to be laterally moved oppositely to each other along direction 12. This relative movement is naturally also true for those portions of surfaces 58 and 21 of layers 18 and 20 from which protrusions 240 and 242 protrude. In turn, this results in a relative movement of the protrusions 240 and 242 relative to each other upon activating the attractive force between layers 18 and 20. As just outlined, this relative movement 244 has a component along direction 12 and a component layer stack direction 30. In particular, as debated in FIG. 23, the layer among layers 18 and 20, where the fixing point 104 lags behind the corresponding fixing point or spacer 54 at the other of layers 18 and 20 along the inclination direction 12, i.e., layer 18 tends to be moved into direction 12 relative to layer 20 and accordingly, in combination with the fact that both layers 18 and 20 are getting closer to each other upon application of the attractive force therebetween, it is favorable if the protrusions 240 and 242 are inclined in the plane spanned by direction 12 and the layer stack direction 30 oppositely to spacers 54. By this measure, a collision as depicted by dashed lines 246, between protrusions 240 and 242, may be avoided or be rendered less likely or may be made to happen at even increased attractive forces between layers 18 and 20, only. In particular, the dashed lines 246 in FIG. 23 shall illustratively demonstrate the position of protrusions 242 of layer 18 relative to the protrusions 240 of layer 20 in case of attractive force having been applied onto layers 18 and 20. FIG. 24 shows a resulting example of oppositely inclined protrusions 240, 242, respectively.

Thus, with respect to FIGS. 22 to 24, it has been shown that all of the above presented aspects and their embodiments may be provided with comb-like or parallelogram shape structure shown in FIGS. 22 to 24. This structure allows to interdigitate both layers 18 and 20 which act as electrodes of the plate capacitor. Thereby, an effective actuation at low voltages is permitted. Alternatively, the height of the spacer 54 or the distance between layers 18 and 20 may be increased at the same voltage to attractive-force effectiveness. This in turn permits to achieve larger deflections of the deflectable element. Interdigitate protrusions as they are shown in FIGS. 22 to 24 may also be called comb electrodes. To realize such geometries, it might be useful to understand in each segment the displacement of each sub-segment of layer 18 relative to layer 20, namely in order to create combs that will inter-penetrate each other without reducing the width of their direct gap. This has been illustrated with respect to FIG. 23 in connection with the embodiments of the first aspect. However, it should be noted that also the embodiments of the second aspect, such as for example those having plateau structures or roof structures, could be provided with interdigitate electrodes according to FIGS. 22 to 24.

It should be noted with respect to all of the embodiments described above, that it is possible to operate same in an analog mode or in an analog manner. That is, the attractive force between layers 18 and 20 could be controlled so as to continuously vary between the zero and some maximum force value so as to vary the deflection of the deflectable element 10 gradually between no deflection and some maximum deflection. However, when increasing some attractive force between layers 18 and 20, layers 18 and 20 will tend to collide. In case of layers 18 and 20 acting as electrodes of a plate capacitor, this would lead to a short circuiting between both electrodes. In order to avoid this, internal surfaces of gaps 32 could be at least partially covered by an insulating film 250 as exemplarily shown in FIG. 25 representatively using the embodiment of FIG. 13 as a basis. In particular, even if owing to an attractive force between layers 18 and 20, layer 18 collapses onto layer 20 insulating film 250 is positioned within the gap's 32 surfaces so that a short circuiting between layers 18 and 20 is avoided. FIG. 13, for example, illustrates that the insulating film 250 completely covers the interfaces between gaps 32 on the one hand and layers 18 and 20, respectively, on the other hand. However, the insulating film could also be formed merely at portions where the collision leads to layer 18 hitting layer 20. The micromechanical device of FIG. 25 may be operated at another mode than the just outlined analog mode where the curvature of the deflectable element is changed gradually. Rather, it could be that the insulating film 250 or some other additional insulation material at the surface of one or both of layers 18 or 20 avoid a short circuiting between layers 18 and 20 and that this avoidance is used to operate the micromechanical device in a binary sense: either the collision situation is caused by exerting an attractive force onto layers 18 and 20 which exceeds some threshold, or the deflectable element 10 is left undeflected, i.e., no attractive force is applied. In the case of using a plate capacitor as a laminar actuator, the collision situation would be a pull-in situation where the applied voltage onto layers 18 and 20 exceeds some pull-in voltage. Thus, a digital control of a micromechanical device of FIG. 25 would be possible by addressing a selection of the actuator segments with voltages above the pull-in voltage. For example, the micromechanical device could be formed as a cantilever, and accordingly the digital control could allow a digital control of the cantilever's tip.

Further, with respect to all of the above outlined embodiments, it should be clear that the segments of the embodiments of the second and third aspect of the present application, for example, do not necessarily have to be the same for the whole deflectable element. Rather, the segment design may vary. For example, they may have different lengths along the lateral direction 12. For example, there could be a chirp in the segment length along direction 12. In that case, increasing the attractive force between layers 18 and 20 gradually would lead to the segment successively experiencing the pull-in situation while ramping the voltage applied between layers 18 and 20. Thus, a digital-like deflection behavior would be possible. In combination with a group-wise addressing of the segments, the varying segment design allows a fine tuning of the digital control.

Further, it should be noted that although the structures and embodiments described above been primarily described in accordance with operating same using an attracting force between both layers 18 and 20, it should be noted that operating all of these micromechanical devices by creating a repelling force between both layers 18 and 20 would likewise be possible, thereby yielding a deflection of the deflective element into a direction opposite to the direction described with respect to the above embodiments. For example, in case of the layers forming electrodes of a plate capacitor, the same voltage relative to a reference potential could be applied to layers 18 and 20, thereby achieving an electrostatic repelling force. Alternatively, magnetic repelling forces may be exerted between layers 18 and 20 in case of these layers being, as outlined above, formed as spirals or coils of magnets activated so that the magnetic pole is generated using the same phase oppositely.

Thus, the above description revealed micromechanical devices comprising an actively deflectable element. The activation is performed by a layer stack which causes the deflection responsive to attractive forces acting upon the layers of the layer stack.

While this invention has been described in terms of several embodiments, there are alterations, permutations, and equivalents which fall within the scope of this invention. It should also be noted that there are many alternative ways of implementing the methods and compositions of the present invention. It is, therefore, intended that the following appended claims be interpreted as including all such alterations, permutations and equivalents as fall within the true spirit and scope of the present invention.

The invention claimed is:

1. A micromechanical device comprising a deflectable element comprising a layer stack of a first layer and a second layer, wherein the first layer and second layer are mechanically fixed to each other by spacers so that the first layer is spaced apart from the second layer in a layer stack direction, wherein
   the spacers are inclined relative to the layer stack direction into a lateral direction,
   wherein the deflectable element is deflected along the lateral direction into or opposed to the layer stack direction by way of exposing the layer stack to an attractive force between the first layer and the second layer.

2. The micromechanical device according to claim 1, wherein a ratio between thicknesses of the first and second layers lies between 0.2 and 5, both inclusively.

3. The micromechanical device according to claim 1, wherein a ratio between thicknesses of the first and second layers lies between 3/4 and 4/3, both inclusively.

4. The micromechanical device according to claim 1, wherein a gap between the first and second layers is, with neglecting the spacers, of planar shape.

5. The micromechanical device according to claim 1, wherein the spacers longitudinally extend in a further lateral direction transverse to the lateral direction and are distributed at a predetermined mean pitch along the lateral direction.

6. The micromechanical device according to claim 1, wherein a mean lateral width of the spacers measured along the lateral direction lies between 0.001 and 1000 times a distance between the first and second layers.

7. The micromechanical device according to claim 1, wherein the layer stack forms a plate capacitor with the first and second layers forming electrodes of the plate capacitor.

8. The micromechanical device according to claim 1, wherein the spacers are of a parallelepiped shape or formed like tilted walls comprising a conical cross-section.

9. The micromechanical device according to claim 1, wherein the spacers are formed, at least partly, of an insulating material.

10. The micromechanical device according to claim 1, wherein each spacer is, at least partly, formed of an insulating material such that an end of the respective spacer which faces the first layer is insulated from an end of the respective spacer which faces the second layer by the insulating material.

11. The micromechanical device according to claim 9, wherein each spacer is also formed of a conductive material of the first layer and the second layer with the conductive material of the first layer and the second layer extending into the spacers so as to abut, within the spacers, on the insulating material.

12. The micromechanical device according to claim 11, wherein the conductive material of the first layer and the second layer abuts on the insulating material along a surface which, when exposing the layer stack to the attractive force, crosses a tensile stress field developing in the spacers due to the attractive force perpendicularly and is in parallel to a compressive stress of a compression field in the spacers developing in the spacers due to the attractive force.

13. The micromechanical device according to claim 12, wherein the conductive material of the first layer and the second layer is interdigitated with the insulating material of the spacers.

14. The micromechanical device according to claim 1, wherein, in the segments, protrusions of the first layer and the second layer protrude into the gap so as to interdigitally engage with each other.

15. The micromechanical device according to claim 14, wherein the protrusions of the first layer and the second layer protrude substantially in parallel to each other in a direction substantially transverse to a relative direction along which portions of the first and second layers from which the protrusions protrude, move relative to each other responsive to the deflection of the deflective element by way of the exposition of the layer stack to the attractive force.

16. The micromechanical device according to claim 1, wherein an inner surface of the gap is at least partially covered by an insulating film so that the first and second layers keep on being insulated from each other even in case of a mechanical contact of the first and second layers due to the attractive force between the first layer and the second layer exceeding a pull-in force.

17. The micromechanical device according to claim 1, wherein the deflectable element is formed of a part of a substrate which is bordered, except for at least a suspension site of the deflectable element, by an opening continuous in a substrate thickness direction, wherein the layer stack direction is in the substrate thickness direction.

18. The micromechanical device according to claim 1, wherein the deflectable element is formed of a part of a substrate which is bordered, except for at least a suspension site of the deflectable element, by an opening continuous in a substrate thickness direction, wherein the layer stack direction is lateral with respect to the substrate.

19. The micromechanical device according to claim 1, wherein one of the first and second layers is unsuspended whereas the other of the first and second layers is suspended to a suspension site of the deflectable element.

20. A micromechanical device comprising a deflectable element, wherein the deflectable element comprises a laminar actuator which is formed as a layer stack comprising a distal layer and a proximal layer extending along and, in a deflection direction, spaced apart from a neutral axis of the deflectable element, wherein the proximal layer is arranged between the distal layer and the neutral axis and the layer stack is segmented into segments along a lateral direction, wherein the distal layer is mechanically fixed between the segments so that the distal layer is spaced apart from the proximal layer and so that the deflectable element is deflected along the lateral direction into or opposed to the deflection direction by way of exposing the layer stack to an attractive force between the proximal layer and the distal layer, wherein
in each segment, a surface of the distal layer, facing the proximal layer via a gap, bulges out towards or away from the neutral axis wherein a ratio of half a length of the respective segment in the lateral direction to a difference between a maximum distance of said surface from the neutral axis and a minimum distance of said surface from the neutral axis lies between $\sin(1°)$ and $\sin(10°)$, both inclusively.

21. The micromechanical device according to claim 20, wherein the surfaces bulge out in each segment rounded, angled or stepped.

22. The micromechanical device according to claim 20, wherein the layer stack forms a plate capacitor with the proximal layer forming a proximal electrode of the plate capacitor and the distal layer forming a distal electrode of the plate capacitor.

23. The micromechanical device according to claim 20, wherein, in each segment, said surface is formed such that said surface comprises exclusively at least one plane portion and at least two ramp portions following each other along the lateral direction such that the at least one plane portion is parallel to the neutral axis and the at least two ramp portions are inclined relative to the neutral axis with at least two of the at least two ramp portions being oppositely inclined relative to the lateral direction.

24. The micromechanical device according to claim 23, wherein an angle of inclination of the plane in which said surface is arranged in the at least two ramp portions to the neutral axis corresponds to an angle between two crystal planes of the deflectable element, of which a first one is in parallel to the at least one plane portion and a second one is in parallel to a respective one of the at least two ramp portions.

25. The micromechanical device according to claim 20, wherein, in each segment, said surface is formed such that said surface comprises exclusively at least three plane portions and at least two ramp portions alternatingly in the lateral direction such that each of the at least two ramp portions is positioned between two of the at least three plane portions and the at least three plane portions are parallel to, but at different distances to the neutral axis and the at least two ramp portions are inclined relative to the neutral axis.

26. The micromechanical device according to claim 25, wherein an angle of inclination of the plane in which said surface is arranged in the at least two ramp portions to the neutral axis corresponds to an angle between two crystal planes of the deflectable element, of which a first one is in parallel to the at least three plane portions and a second one is in parallel to a respective one of the at least two ramp portions.

27. The micromechanical device according to claim 20, wherein the deflectable element is formed of a part of a substrate which is bordered, except for at least a suspension site of the deflectable element, by an opening continuous in a substrate thickness direction, wherein the direction of deflection is in the substrate thickness direction.

28. The micromechanical device according to claim 20, wherein in each segment, said surface is segmented into a first and a second ramp portion along the lateral direction so as to be, in the first ramp portion, in parallel to a plane which is inclined relative to the neutral axis by a first angle of inclination and to be, in the second ramp portion, in parallel to a plane which is inclined relative to a plane by a second angle of inclination which is opposite to the first angle of inclination, wherein the first and the second angles of inclination are each between 1° and 10°, both inclusively.

29. The micromechanical device according to claim 20, wherein the deflectable element is formed of a part of a substrate which is bordered, except for at least a suspension site of the deflectable element, by an opening continuous in a substrate thickness direction, wherein the direction of deflection is lateral with respect to the substrate.

30. The micromechanical device according to claim 20, wherein each segment is configured such that in the respective segment said surface is symmetrical relative to a plane transverse to the lateral direction.

31. The micromechanical device according to claim 20, wherein in each segment the minimum distance is located at the segment boundaries.

32. The micromechanical device according to claim 20, wherein in each segment the maximum distance is located at the segment boundaries.

33. The micromechanical device according to claim 20, wherein, in the segments, protrusions of the distal layer and the proximal layer protrude into the gap so as to interdigitally engage with each other.

34. The micromechanical device according to claim 20, wherein the distal layer is mechanically fixed between the segments
by insolating spacers extending between the distal layer and the proximal layer and being laterally distributed along the lateral direction so as to be laterally positioned between the segments, or
by spacers extending between the distal layer and the proximal layer, being laterally distributed along the lateral direction so as to be laterally positioned between the segments, and being insulated from at least one of the distal and proximal layer, or
at voids in one of the distal or proximal layer so that the other one of the distal or proximal layer is fixed to an insulating material of the deflectable element at the voids, or
by bulges in one of the distal or proximal layer, bulging towards the other of the distal or proximal layer so that the one of the distal or proximal layer is fixed to the other of the distal or proximal layer in a manner insulated from the other of the distal or proximal layer via an insulating layer.

35. The micromechanical device according to claim 20, wherein an inner surface of the gap is at least partially covered by an insulating film so that the distal and proximal layers keep on being insulated from each other even in case of a mechanical contact of the distal and proximal layers due to the attractive force between the proximal layer and the distal layer exceeding a pull-in force.

36. The micromechanical device according to claim 20, wherein the distance of the distal layer's surface from the neutral axis is equal at each segment boundary.

37. The micromechanical device according to claim 20, wherein, in each segment, a gap between the proximal and distal layer is of constant thickness and formed conforming to said surface.

38. The micromechanical device according to claim 20, wherein the deflectable element comprises a surface facing away from the distal layer which is conforming to the gap.

39. A micromechanical device comprising a deflectable element, wherein the deflectable element comprises a laminar actuator which is formed as a layer stack comprising a distal layer and a proximal layer extending along and, in a deflection direction, spaced apart from a neutral axis of the deflectable element, wherein the proximal layer is arranged between the distal layer and the neutral axis and the layer stack is segmented into segments along a lateral direction, wherein the distal layer is mechanically fixed between the segments so that the distal layer is spaced apart from the proximal layer and so that the deflectable element is deflected along the lateral direction into or opposed to the deflection direction by way of exposing the layer stack to an attractive force between the proximal layer and the distal layer, wherein
in each segment, the gap between the proximal and distal layer is non-planar and the deflectable element comprises a surface facing away from the gap and conforming to the gap.

40. The micromechanical device according to claim 39, wherein the layer stack forms a plate capacitor with the proximal layer forming a proximal electrode of the plate capacitor and the distal layer forming a distal electrode of the plate capacitor.

41. The micromechanical device according to claim 39, wherein the surface is an outer face of the deflectable element which is opposes the gap across the neutral axis.

42. The micromechanical device according to claim 39, wherein the deflectable element comprises, opposite to the layer stack, another layer stack extending along and, in a deflection direction, spaced apart from the neutral axis of the deflectable element, wherein the surface is a first portion of an inner surface of cavities inside the deflectable element which are, one per segment, distributed along the neutral axis, wherein a second portion of the inner surface of the cavities is conforming to the gap between the proximal and distal layers of the other layer stack.

43. The micromechanical device according to claim 39, wherein the deflectable element is formed of a part of a substrate which is bordered, except for at least a suspension site of the deflectable element, by an opening continuous in a substrate thickness direction, wherein the direction of deflection is in the substrate thickness direction.

44. The micromechanical device according to claim 39, wherein the deflectable element is formed of a part of a substrate which is bordered, except for at least a suspension site of the deflectable element, by an opening continuous in a substrate thickness direction, wherein the direction of deflection is lateral with respect to the substrate.

45. The micromechanical device according to claim 39, wherein, in the segments, protrusions of the distal layer and the proximal layer protrude into the gap so as to interdigitally engage with each other.

46. The micromechanical device according to claim 39, wherein the distal layer is mechanically fixed between the segments
by insolating spacers extending between the distal layer and the proximal layer and being laterally distributed along the lateral direction so as to be laterally positioned between the segments, or
by spacers extending between the distal layer and the proximal layer, being laterally distributed along the lateral direction so as to be laterally positioned between the segments, and being insulated from at least one of the distal and proximal layer, or
at voids in one of the distal or proximal layer so that the other one of the distal or proximal layer is fixed to an insulating material of the deflectable element at the voids, or
by bulges in one of the distal or proximal layer, bulging towards the other of the distal or proximal layer so that the one of the distal or proximal layer is fixed to the other of the distal or proximal layer in a manner insulated from the other of the distal or proximal layer via an insulating layer.

47. The micromechanical device according to claim 39, wherein an inner surface of the gap is at least partially covered by an insulating film so that the distal and proximal layers keep on being insulated from each other even in case of a mechanical contact of the distal and proximal layers due to the attractive force between the proximal layer and the distal layer exceeding a pull-in force.

* * * * *